(12) United States Patent
Watanabe et al.

(10) Patent No.: US 10,568,250 B2
(45) Date of Patent: Feb. 18, 2020

(54) COMPONENT MOUNTING DEVICE AND METHOD OF MOUNTING COMPONENT

(71) Applicant: Panasonic Intellectual Property Management Co., Ltd., Osaka (JP)

(72) Inventors: Hideaki Watanabe, Fukuoka (JP); Dai Yokoyama, Yamanashi (JP); Shigeki Imafuku, Yamanashi (JP); Yosuke Nagasawa, Yamanashi (JP); Yew Song Danny Ng, Singapore (SG); Yet Ling Loh, Singapore (SG)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/907,979

(22) Filed: Feb. 28, 2018

(65) Prior Publication Data

US 2018/0255670 A1 Sep. 6, 2018

(30) Foreign Application Priority Data

Mar. 6, 2017 (JP) .................. 2017-042097

(51) Int. Cl.
*H05K 13/04* (2006.01)
(52) U.S. Cl.
CPC .............. *H05K 13/0408* (2013.01)
(58) Field of Classification Search
CPC .............. H05K 13/0408; B25J 15/08
See application file for complete search history.

(56) References Cited

U.S. PATENT DOCUMENTS

| 2,743,954 | A | * | 5/1956 | Östlund | .................. B66C 1/422 294/106 |
|---|---|---|---|---|---|
| 5,161,846 | A | * | 11/1992 | Yakou | .................. B25J 9/1612 294/106 |
| 8,690,213 | B2 | * | 4/2014 | Harada | ................ B25J 15/0057 294/119.1 |
| 9,016,743 | B2 | * | 4/2015 | Itoh | ................... G01N 35/0099 294/106 |
| 2017/0057101 | A1 | * | 3/2017 | Malstrom | .............. B25J 19/063 |

FOREIGN PATENT DOCUMENTS

| JP | H05-318366 A | 12/1993 |
|---|---|---|
| JP | H05-335798 A | 12/1993 |
| JP | H11-150397 A | 6/1999 |
| JP | 2003-243891 A | 8/2003 |
| JP | 2004-017257 A | 1/2004 |
| JP | 2009-200532 A | 9/2009 |
| JP | 2015-037084 A | 2/2015 |
| JP | 2016-028452 A | 2/2016 |

* cited by examiner

*Primary Examiner* — Stephen A Vu
(74) *Attorney, Agent, or Firm* — Pearne & Gordon LLP

(57) ABSTRACT

A component mounting device mounting a component on a substrate comprises a pair of opening/closing members opening and closing, and a plurality of adapters detachably attached to the opening/closing members; the adapters are attached to the opening/closing members depending on the component to be mounted so as to clamp the component by using the adapters; and the plurality of adapters includes first adapters each having a flat clamping surface clamping a body of the component and second adapters each having a holding groove holding an axial portion of the component.

8 Claims, 29 Drawing Sheets

(a)

(b)

(a)

(b)

COMPONENT MOUNTING DEVICE AND METHOD OF MOUNTING COMPONENT

CROSS-REFERENCE TO RELATED APPLICATIONS

The present application claims priority under 35 U.S.C. § 119 to Japanese Patent Application No. 2017-42097, filed Mar. 6, 2017. The contents of this application are incorporated herein by reference in their entirety.

BACKGROUND OF THE INVENTION

1. Field of the Invention

The present invention relates to a component mounting device for mounting a component on a substrate and a method of mounting a component by using a component mounting device.

2. Description of the Related Art

A component mounting device known in the field of mounting uses a clamping device to clamp a component supplied by a component supply part such as a parts feeder and mount the component onto a substrate. As described in Japanese Laid-Open Patent Publication No. 5-318366, for example, a conventionally proposed clamping device has a configuration in which two movable pieces (clamping members) are moved in directions approaching each other from both sides of a component to clamp the component.

As described in Japanese Laid-Open Patent Publication Nos. 2015-37084 and 2016-28452, when an axial lead component and a radial lead component are mounted on a substrate, respective dedicated clamping devices are used.

SUMMARY OF THE INVENTION

However, providing dedicated clamping devices corresponding to components in this way causes problems of complicated handling of the devices and increased device costs.

It is therefore an object of the present invention to provide a component mounting device capable of easily changing a clamping form depending on a component and a method of mounting a component by using the component mounting device.

A component mounting device of an aspect of this disclosure is a component mounting device for mounting a component on a substrate comprising a pair of opening/closing members opening and closing and a plurality of adapters detachably attached to the opening/closing members in which the adapters are attached to the opening/closing members depending on the component to be mounted so as to clamp the component by using the adapters, and in which the plurality of adapters includes first adapters each having a flat clamping surface clamping a body of the component and second adapters each having a holding groove holding an axial portion of the component.

A method of mounting a component of an aspect of this disclosure is a method of mounting a component by using a component mounting device for mounting a component on a substrate, in which the component mounting device includes a plurality of adapters detachably attached to a pair of opening/closing members opening and closing, in which the plurality of adapters includes first adapters each having a flat clamping surface clamping a body of the component and second adapters each having a holding groove holding an axial portion of the component, and in which the adapters corresponding to the component to be mounted are selected and attached to the opening/closing members so as to clamp the component by using the attached adapters for mounting on the substrate.

The present invention can provide the component mounting device capable of easily changing a clamping form depending on a component and the method of mounting a component by using the component mounting device.

DESCRIPTION OF THE PREFERRED EMBODIMENTS

Figure 1:
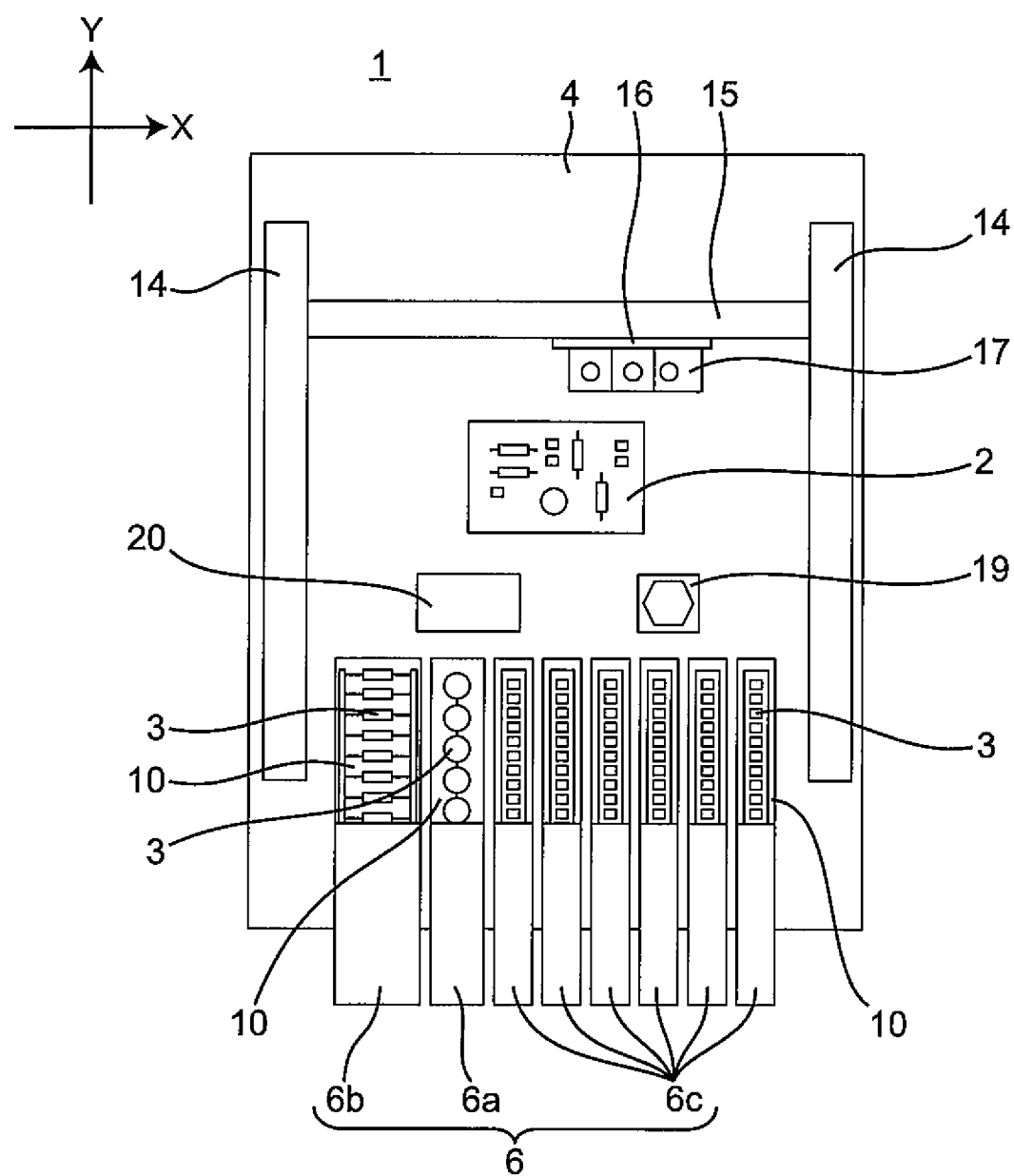
FIG. 1 is plane view of a component mounting device according to an embodiment of the present invention.

A component mounting device according to an embodiment of the present invention will be described with reference to FIG. 1. The component mounting device 1 has a function of mounting a component 3 on a substrate 2. Hereinafter, an X direction, a Y direction, and Z direction are defined as a conveying direction horizontal to the substrate 2, a direction orthogonal to the X direction in a horizontal plane, and a direction perpendicular to the XY plane, respectively.

A component supply unit 6 supplying the component 3 is disposed on an upper surface of a base 4 included in the component mounting device 1. The component supply unit 6 includes a first supply unit 6a supplying a radial lead component, a second supply unit 6b supplying an axial lead component, and a third supply unit 6c supplying a chip component. The radial lead component is a component having a lead (first lead) projecting downward from a lower portion of a body. The axial lead component is a component having a lead (second lead) projecting laterally from both sides of a body with a tip bent downward. The first supply unit 6a, the second supply unit 6b, and the third supply unit 6c are disposed in parallel in the X direction. The component supply unit 6 supplies the component 3 by a parts feeder 10 such as a radial feeder, an axial feeder, or a tape feeder.

Y-axis beams 14 are disposed at both ends of the base 4 in the X direction and the Y-axis beams 14 are provided with an X-axis beam 15 movable in the Y direction. A plate-shaped plate member 16 is attached to the X-axis beam 15 slidably in the X direction, and a mounting head 17 is attached to the plate member 16. By driving the X-axis beam 15 and the plate member 16, the mounting head 17 can be moved in the X and Y directions. The mounting head 17 has a function of taking out and mounting the component 3 from the component supply unit 6 onto the substrate 2.

The base 4 is provided with a component recognition camera 19 having an imaging field of view facing upward and an adapter stocker 20 between the substrate 2 and the component supply unit 6. The component recognition camera 19 takes an image of the component 3 held by the mounting head 17 moving above the camera from below. The adapter stocker 20 stores an adapter 50 (FIGS. 14A and 14B) described later.

Figure 2:
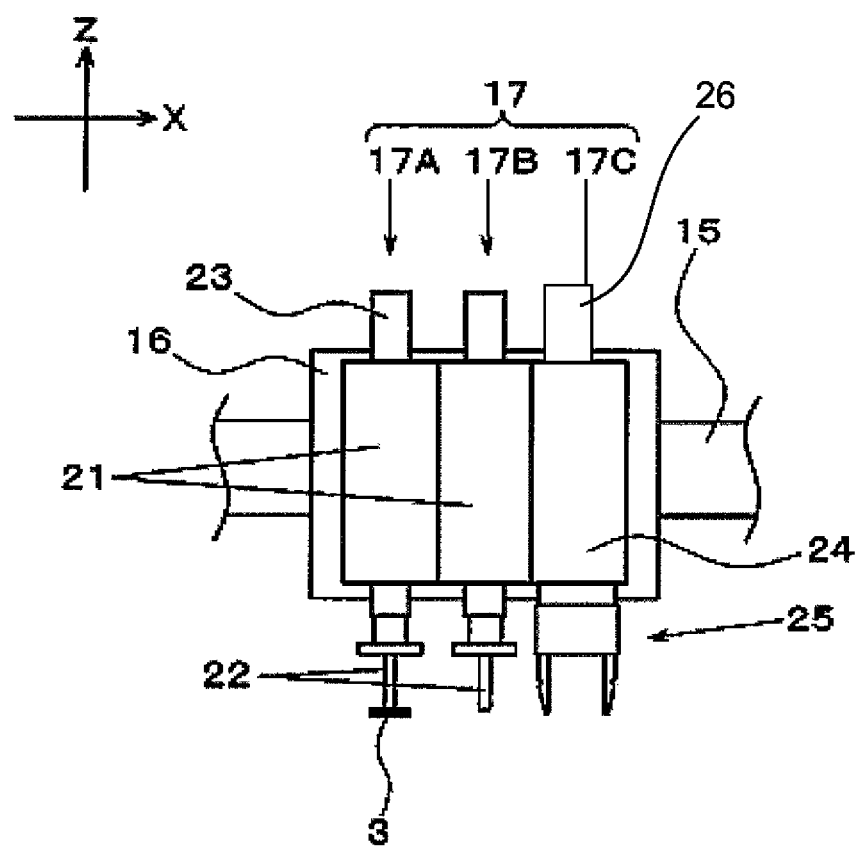
FIG. 2 is a front view of a mounting head included in the component mounting device according to the embodiment of the present invention.

A configuration of the mounting head 17 will be described with reference to FIG. 2. The mounting head 17 is made up of multiple (in this case, three) unit heads 17A, 17B, 17C. The unit heads 17A, 17B are each configured to include a head body 21 and a suction nozzle 22 attached to a lower end portion of the head body 21. The head body 21 has a rotary mechanism (not shown) rotating the suction nozzle 22 in the horizontal direction etc. built-in. The suction nozzle 22 is moved in the Z direction, i.e., raised/lowered, by a nozzle raising/lowering mechanism 23 disposed on the upper side of the head body 21. The suction nozzle 22 sucks and thereby holds the component 3 supplied from the component supply unit 6 and transports and mount the component onto the substrate 2. Although the mounting head 17 is made up of the multiple unit heads 17A, 17B, 17C in this description, the mounting head may be made up of the only one unit head 17C.

Figure 3:
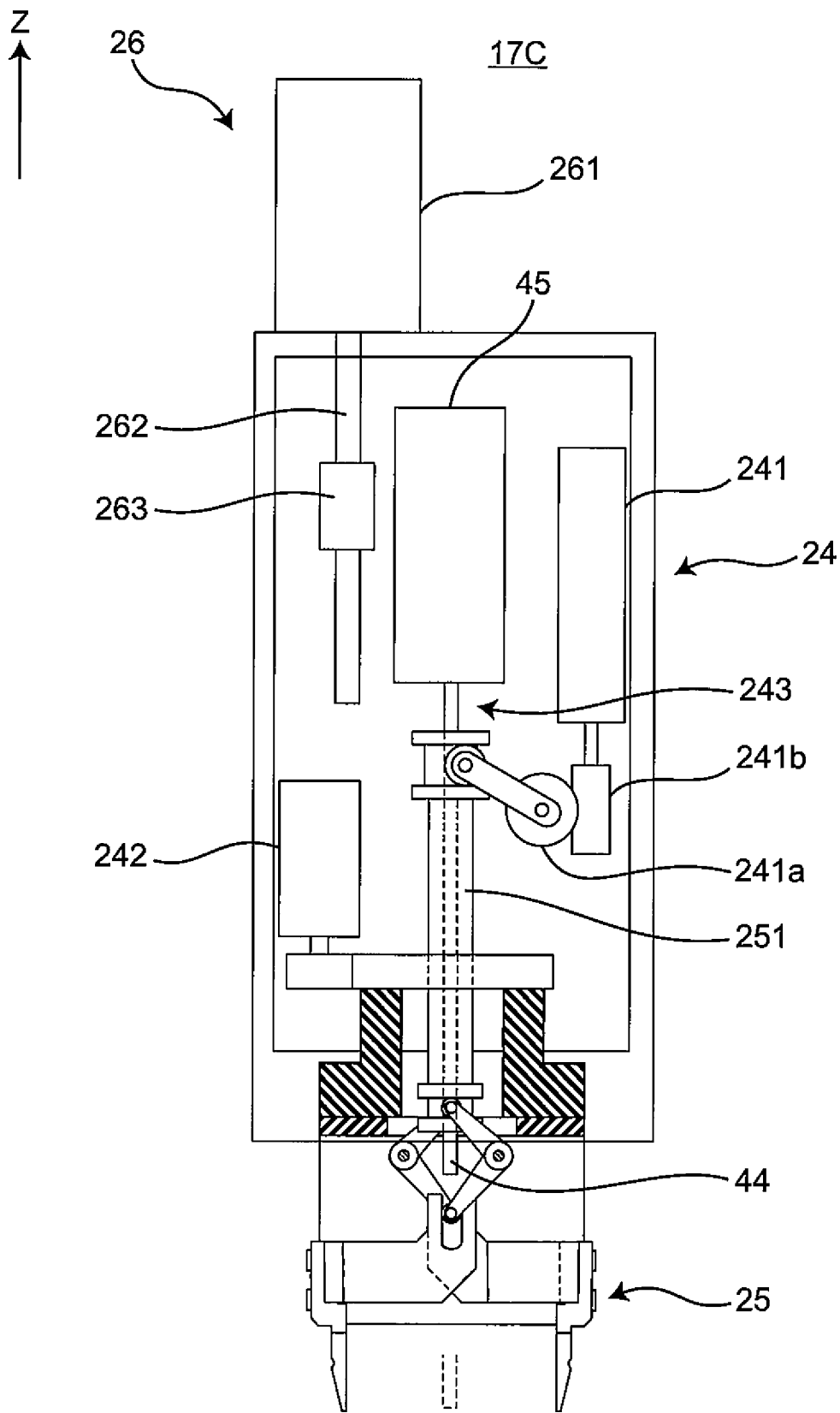
FIG. 3 is a structure diagram of a unit head included in the component mounting device in the embodiment of the present invention.

A configuration of the unit head 17C will be described with reference to FIG. 3. The unit head 17C includes a head body 24, a chuck unit 25 mounted rotatably in the horizontal direction around the vertical direction (Z direction) on the lower side of the head body 24, and a head raising/lowering mechanism 26 disposed on the upper side of the head body 24. The head raising/lowering mechanism 26 includes a raising/lowering motor 261, a feed screw 262 connected to the raising/lowering motor 261, and a nut part 263 screwed to the feed screw 262 and fixed to the head body 24. The head raising/lowering mechanism 26 rotates the feed screw 262 through driving of the raising/lowering motor 261 to move the nut part 263 so that the head body 24 is moved in the Z direction, i.e., raised/lowered.

The head body 24 is provided with a chuck driving motor 241 driving the chuck unit 25, a chuck rotating motor 242 rotating the chuck unit 25 in the horizontal direction, and a pusher device 243. The pusher device 243 includes a pusher 44 and a pusher actuator 45. The pusher 44 is moved in the Z direction, i.e., raised/lowered, by the pusher actuator 45 and is lowered to the component 3 clamped by the chuck unit 25 to push down the component 3.

The chuck unit 25 includes a raising/lowering rod 251. An upper end portion of the raising/lowering rod 251 is connected to the chuck driving motor 241 via a speed reduction mechanism made up of a worm wheel 241a and a worm gear 241b. When the chuck driving motor 241 rotates the worm gear 241b, the worm wheel 241a meshed with the worm gear 241b swings so that the raising/lowering rod 251 coupled to the worm wheel 241a is moved in the Z direction, i.e., raised/lowered.

Figure 4:
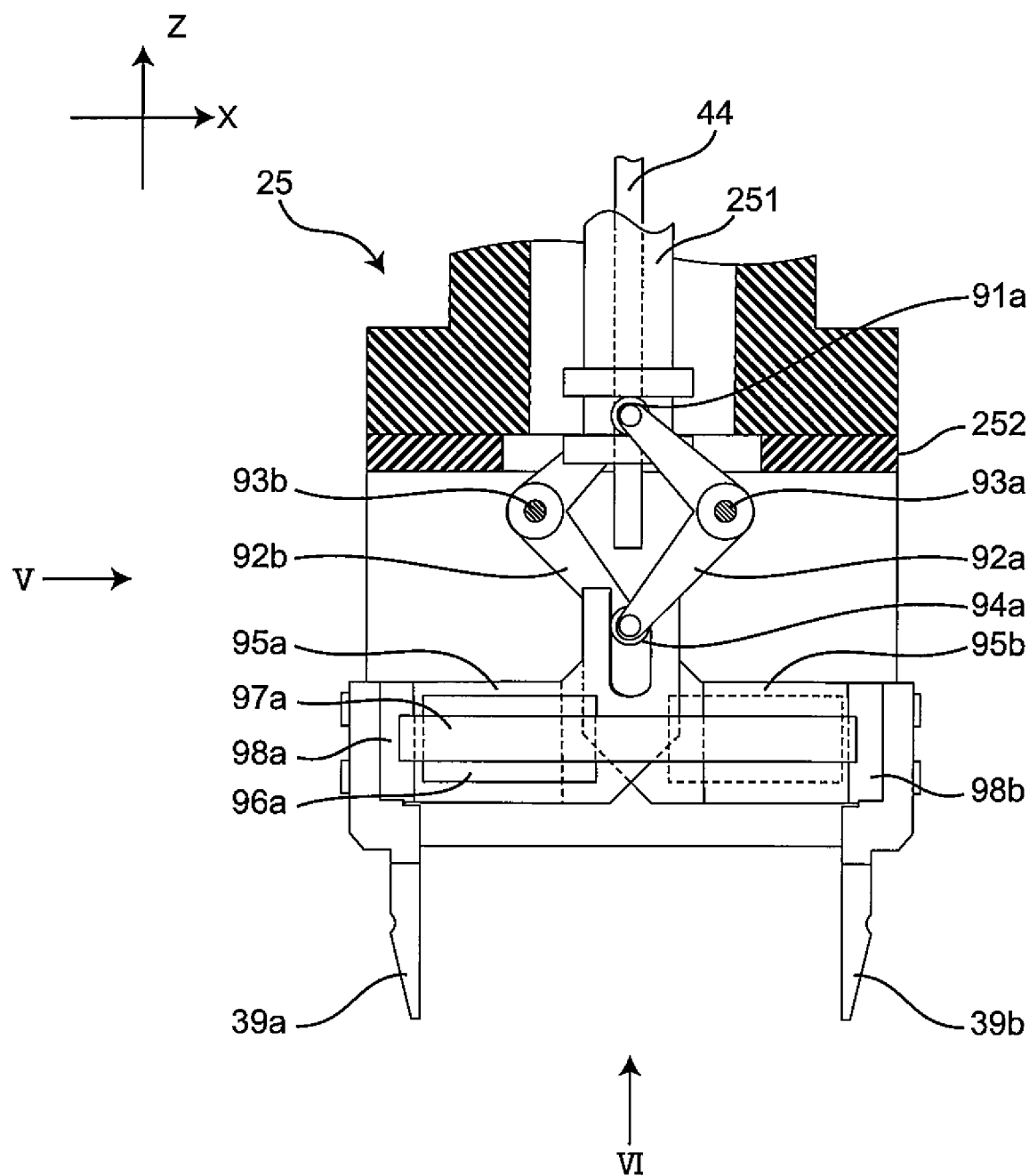
FIG. 4 is a structure diagram of a chuck unit included in the component mounting device in the embodiment of the present invention.
Figure 5:
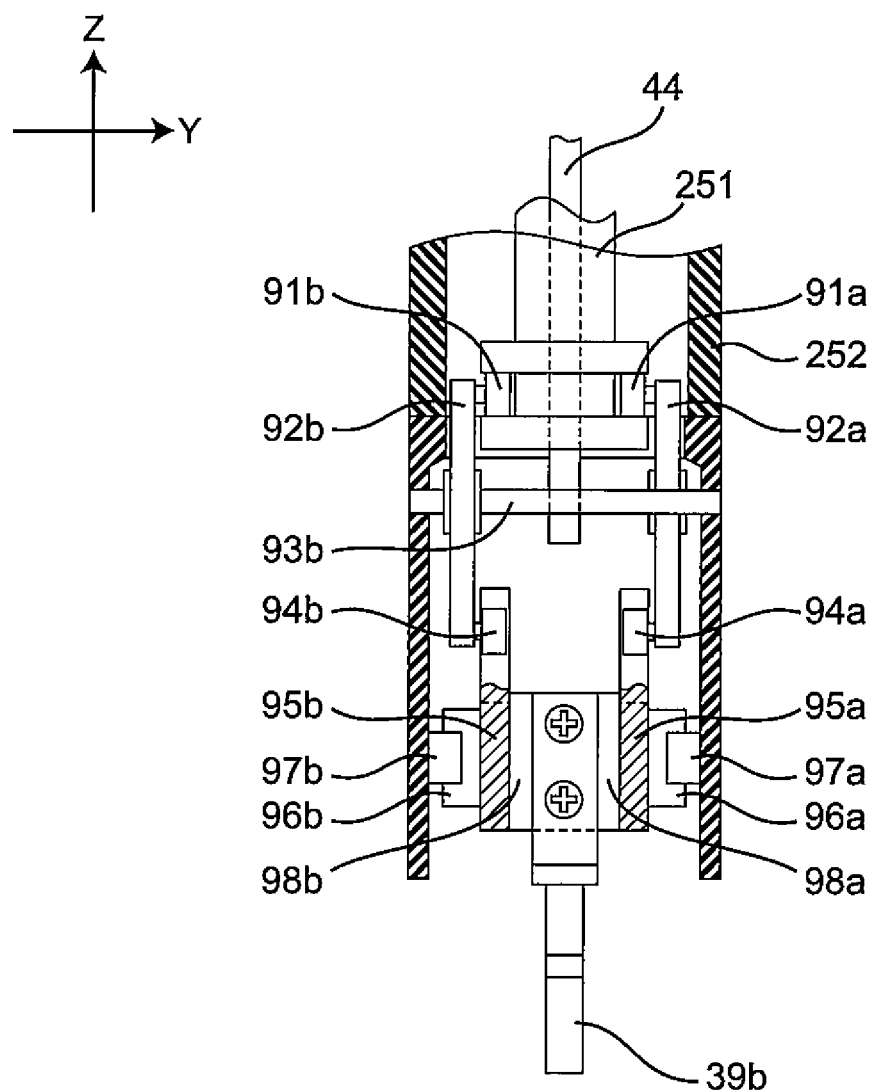
FIG. 5 is a view on arrow V of FIG. 4.
Figure 6:
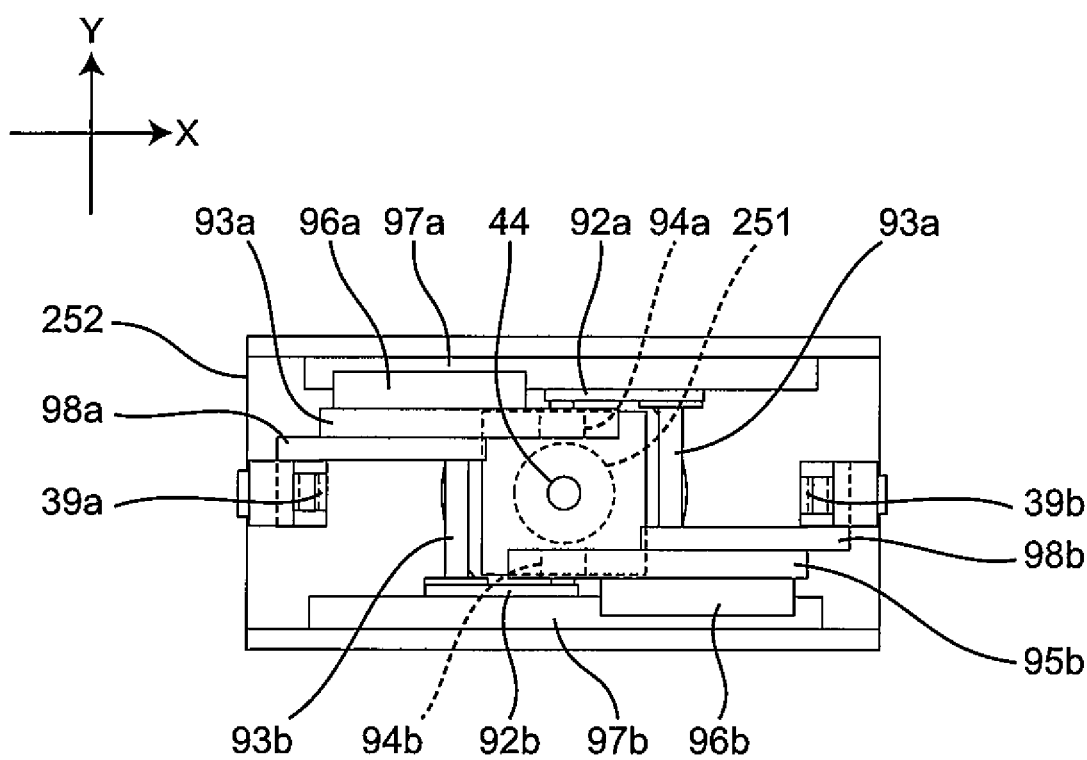
FIG. 6 is a view on arrow VI of FIG. 4.

A configuration of the chuck unit 25 will be described with reference to FIGS. 4 to 7B. FIG. 5 is a view on arrow V of FIG. 4, and FIG. 6 is a view on arrow VI of FIG. 4. The chuck unit 25 has a pair of chuck jaws 39 (39a, 39b) gripping the component 3. The chuck jaw 39a and the chuck jaw 39b are connected to the raising/lowering rod 251 through respective separate members. By raising/lowering the raising/lowering rod 251, the chuck jaws 39a, 39b are moved closer to or away from each other. A connection structure between the raising/lowering rod 251 and the chuck jaws 39a, 39b will hereinafter be described in more detail. As described above, the chuck unit 25 can be rotated in the horizontal direction by the chuck rotating motor 242. However, it is assumed for convenience that the clamping direction of the component 3 of the chuck unit 25 is set to the X direction while the direction orthogonal to the clamping direction is set to the Y direction in a horizontal plane in this description.

One end portion of a lever 92a is connected via a roller 91a to one side of a lower end portion of the raising/lowering rod 251. The roller 91a is disposed movably in the X direction relative to the raising/lowering rod 251. By raising/lowering the raising/lowering rod 251, the lever 92a is allowed to pivot around a lever support shaft 93a. The other end portion of the lever 92a is connected to a slide part 95a via a roller 94a, and the slide part 95a can slide in the X direction as the lever 92a pivots. The slide part 95a is engaged with a rail 97a attached to an inner surface of a frame 252 via a slide block 96a and slides in the X direction along the rail 97a.

Figure 7A:
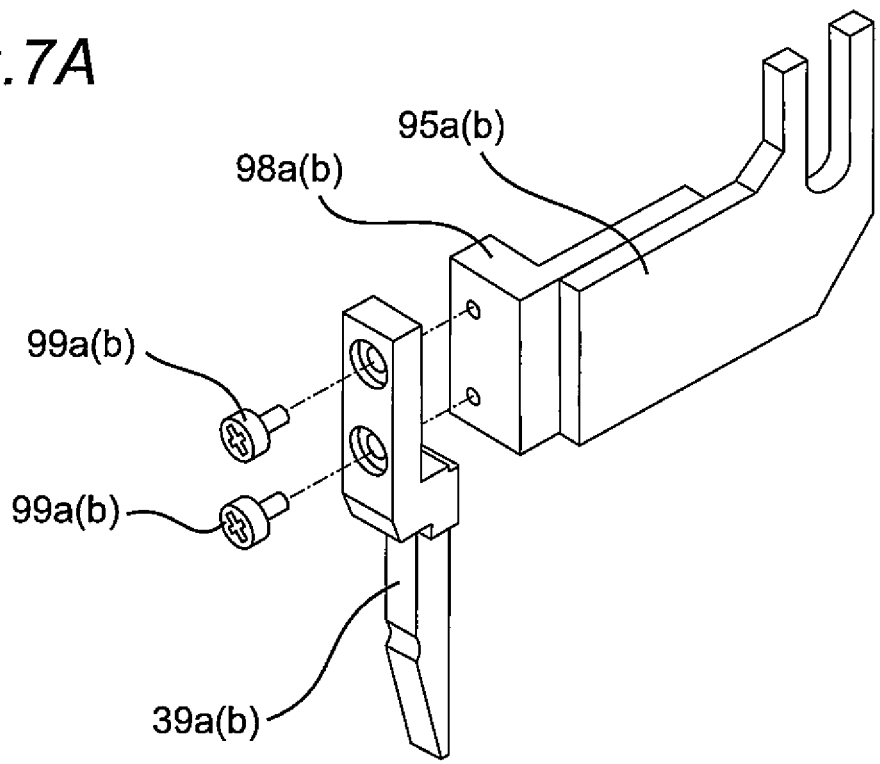
FIG. 7A is an explanatory view of attachment of a chuck jaw.
Figure 7B:
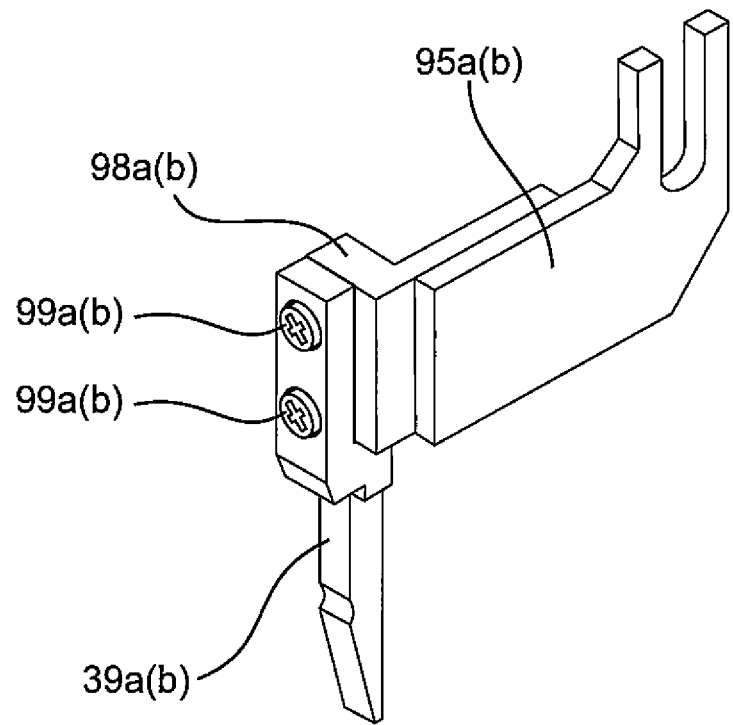
FIG. 7B is an explanatory view of attachment of the chuck jaw.

Particularly, as shown in FIGS. 7A and 7B, a jaw attachment seat 98a is fixed to the slide part 95a, and the chuck jaw 39a is attached to the jaw attachment seat 98a with screws 99a. Therefore, when the slide part 95a slides, the chuck jaw 39a moves in the direction of sliding of the slide part 95a.

On the other hand, one end portion of a lever 92b is connected via a roller 91b to the other side of the lower end portion of the raising/lowering rod 251. The roller 91b is disposed movably in the X direction relative to the raising/lowering rod 251. By raising/lowering the raising/lowering rod 251, the lever 92a is allowed to pivot around a lever support shaft 93b. The other end portion of the lever 92b is connected to a slide part 95b, and the slide part 95b can slide in the X direction as the lever 92b pivots. The slide part 95b is engaged with a rail 97b attached to an inner surface of a frame 252 via a slide block 96b and slides in the X direction along the rail 97b.

Particularly, as shown in FIGS. 7A and 7B, a jaw attachment seat 98b is fixed to the slide part 95b, and the chuck jaw 39b is attached to the jaw attachment seat 98b with screws 99b. Therefore, when the slide part 95b slides, the chuck jaw 39b moves in the direction of sliding of the slide part 95b.

Particularly as shown in FIGS. 5 and 6, since the rail 97a and the rail 97b are oppositely disposed away from each other in the Y direction on the inner surface of the frame 252, the slide part 95a sliding along the rail 97a and the slide part 95b sliding along the rail 97b do not interfere with each other. The chuck jaw 39a and the chuck jaw 39b are adjusted in positions in the Y direction by the jaw attachment seat 98a and the jaw attachment seat 98b and are arranged at positions facing each other in the X direction.

Figure 8:
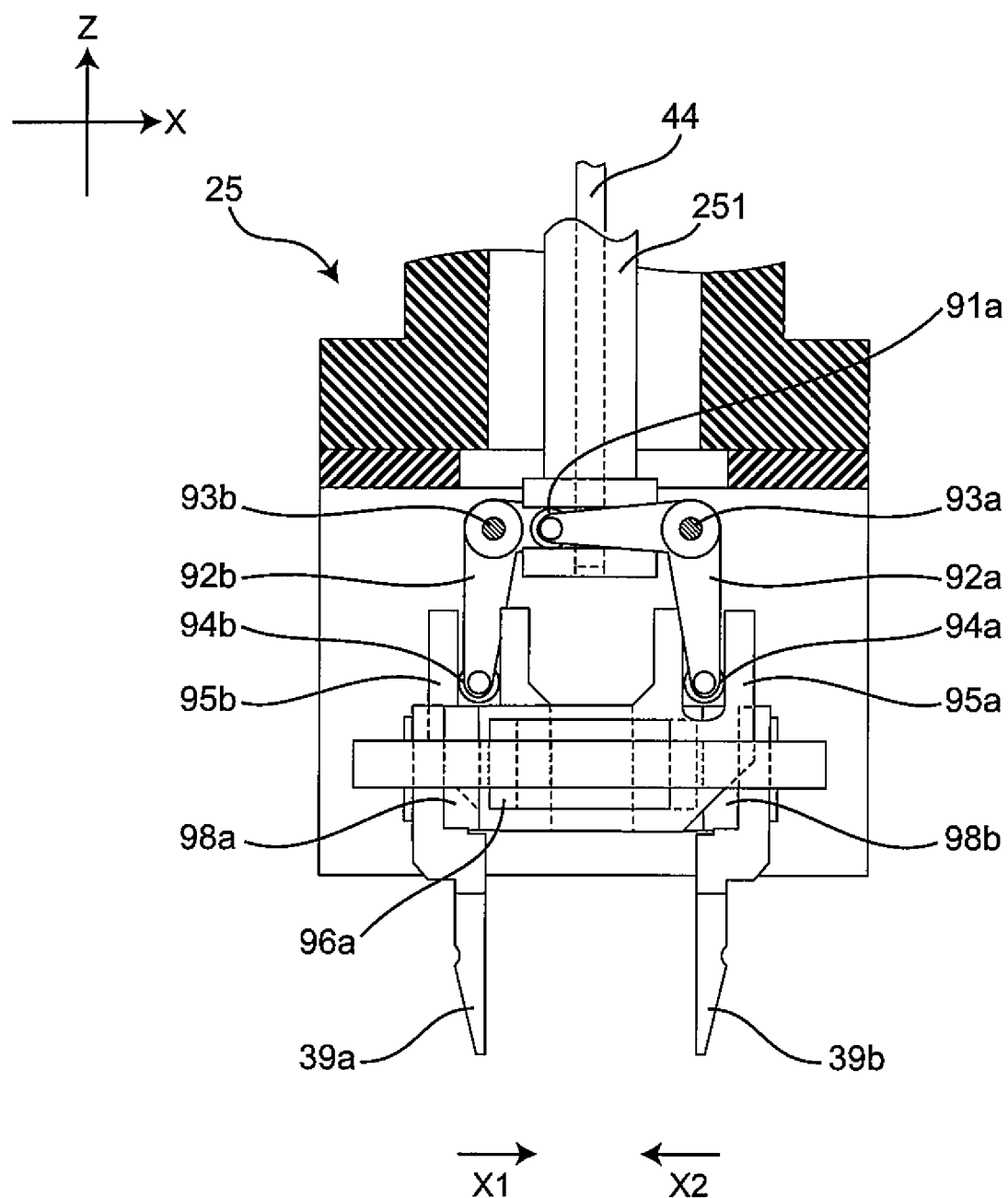
FIG. 8 is an explanatory view of operation of a chuck unit.

The movement of the chuck jaws 39a, 39b will hereinafter be described with reference to FIGS. 4, 8, and 9. FIG. 4 shows a state in which the raising/lowering rod 251 is located at a highest position. When the raising/lowering rod 251 is located at the highest position, the chuck jaw 39a and the chuck jaw 39b are most distant from each other. When the raising/lowering rod 251 is lowered as shown in FIG. 8, the rollers 91a, 91b are accordingly lowered and further moved in an X1 direction. As the rollers 91a, 91b are moved, the lever 92a pivots around the lever support shaft 93a, and the lever 92b pivots around the lever support shaft 93b. As the lever 92a pivots, the slide part 95a slides in the X1 direction via the roller 94a. Similarly, as the lever 92b pivots, the slide part 95b slides in an X2 direction via the roller 94b. Due to the movement of the slide parts 95a, 95b, the chuck jaws 39a, 39b move closer to each other.

Figure 9:
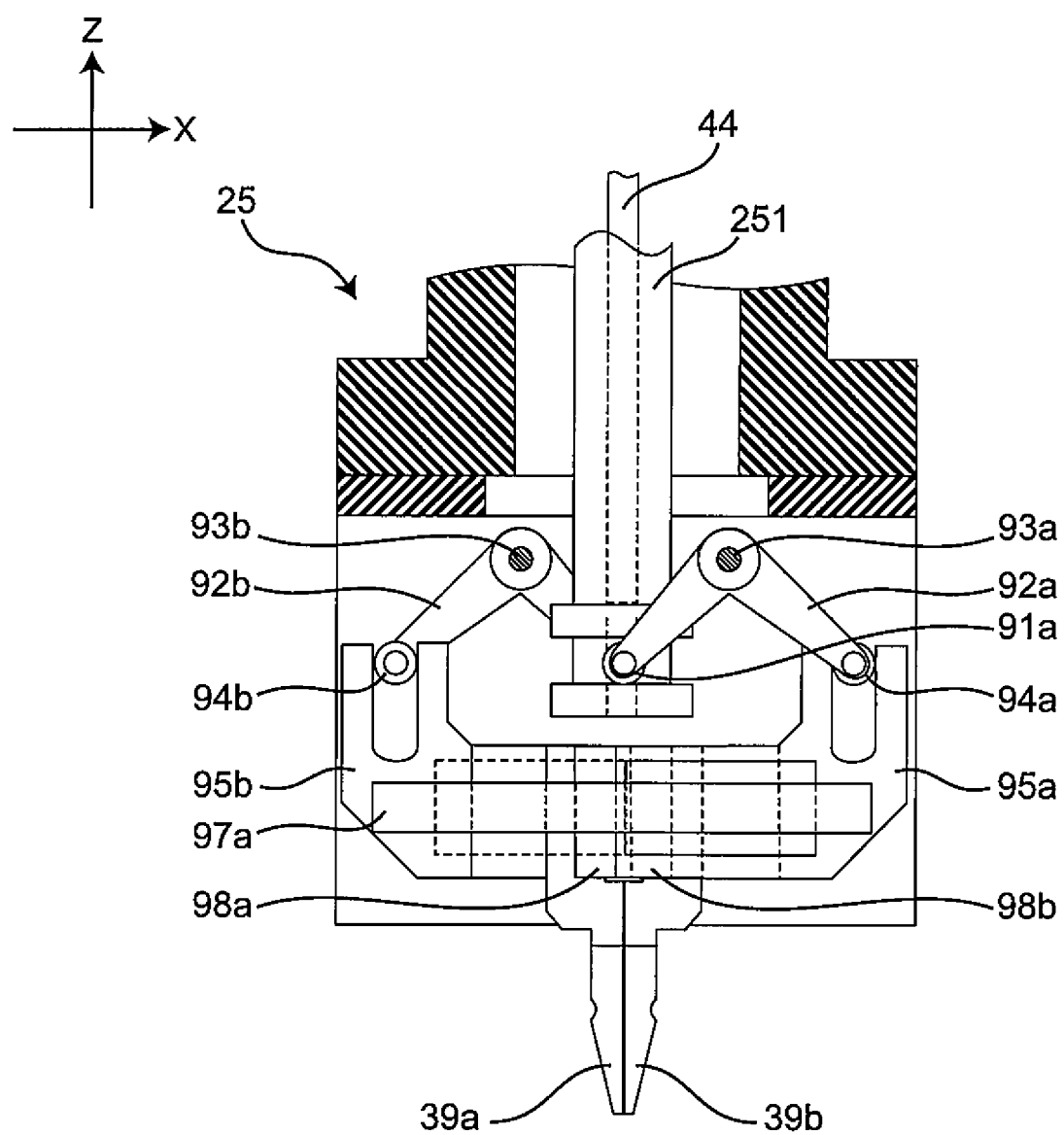
FIG. 9 is an explanatory view of operation of the chuck unit.

When the raising/lowering rod 251 is further lowered to a lowest position, as shown in FIG. 9, the rollers 91a, 91b are lowered and further moved in the X2 direction. The levers 92a, 92b accordingly pivot and, as the levers 92a, 92b pivot, the slide parts 95a, 95b respectively slide in the X1 and X2 directions. Due to the movement of the slide parts 95a, 95b, the chuck jaws 39a, 39b abut each other. Usually, before the chuck jaws 39a, 39b abut each other, i.e., before the raising/lowering rod 251 is lowered to the lowest position, the chuck jaws 39a, 39b clamp the component 3.

Figure 10A:
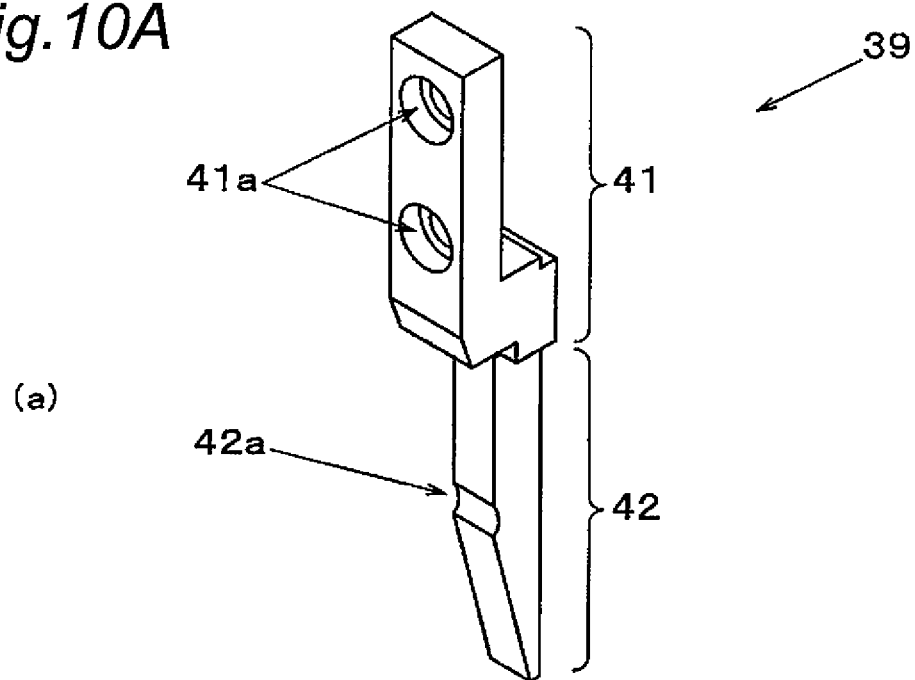
FIG. 10A is a perspective view of the chuck jaw included in the chuck unit constituting the mounting head of the component mounting device in the embodiment of the present invention.
Figure 10B:
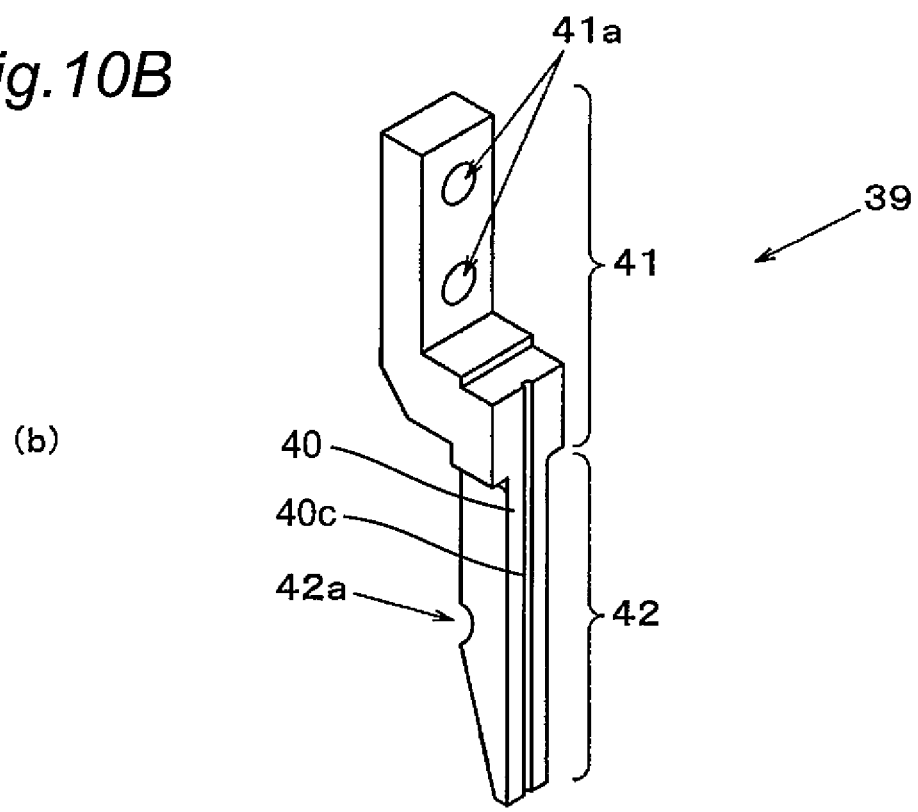
FIG. 10B is a perspective view of the chuck jaw included in the chuck unit constituting the mounting head of the component mounting device in the embodiment of the present invention.

The chuck jaws 39 are used for chucking (clamping) the component 3 and are made of metal resistant to abrasion. In FIGS. 10A and 10B, the chuck jaws 39 are each configured to include a substantially L-shaped base portion 41 and a jaw portion 42 extending in the vertical direction from the lower side of the base portion 41. Multiple hole portions 41a are formed in the base portion 41, and the screws 99a, 99b are screwed through the hole portions 41a into screw holes of the jaw attachment seats 98a, 98b.

A locking groove 42a is formed on a surface of the chuck jaw 39 on the side opposite to a clamping surface 40. The locking groove 42a is used when an adapter 50 described later is attached.

The clamping surface 40 of the chuck jaw 39 has a holding groove 90c formed for holding a lead of an axial lead component. The holding groove 40c extends toward a tip of the chuck jaw 39 to guide the lead toward the substrate 2.

Figure 11A:
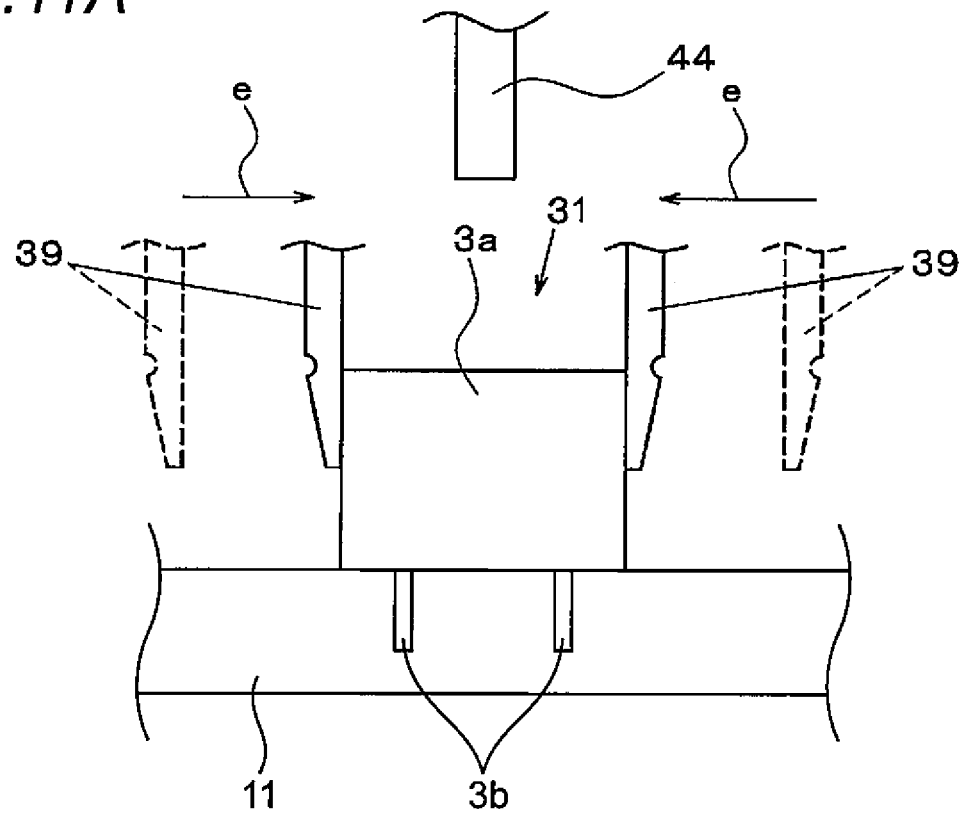
FIG. 11A is an explanatory view of a mounting operation of a radial lead component using the chuck unit in the embodiment of the present invention.
Figure 11B:
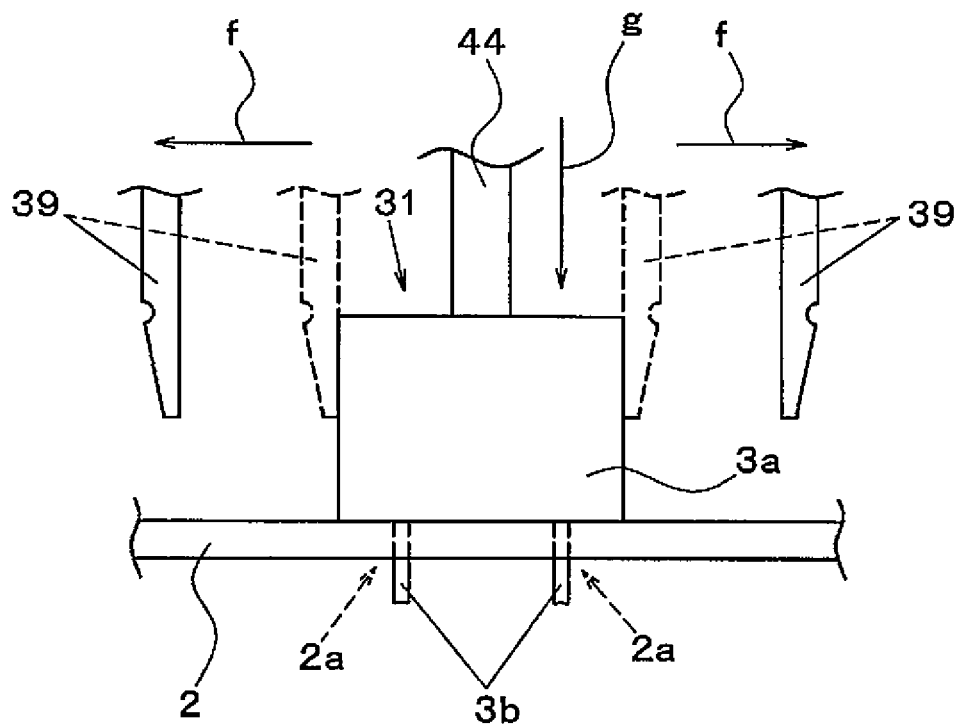
FIG. 11B is an explanatory view of a mounting operation of a radial lead component using the chuck unit in the embodiment of the present invention.

Description will be made of clamping of a component (first component) 31 and a mounting operation onto the substrate 2 with the chuck unit 25 when the component 3 is a radial lead component with reference to FIGS. 11A and 11B. The operation described below is implemented by a control part 70 (FIG. 24) of the component mounting device 1 controlling various mechanisms including a drive motor 37. As shown in FIG. 11A, the component 31 serving as a work object of the chuck unit 25 is a radial lead component including a pair of leads (first leads) 3b on a lower surface of a body (first body) 3a and is supplied by the first supply unit 6a. The first supply unit 6a includes a conveying chute 11 conveying the component 31 to a supply position for the chuck unit 25 while supporting the lower surface of the body 3a, and the component 31 is supplied while being supported by the conveying chute 11.

First, as shown in FIG. 11A, a pair of the chuck jaws 39 is preliminarily moved in directions away from each other (see the chuck jaws 39 indicated by broken lines) and is lowered to the component 31 on the conveying chute 11 to enclose the body 3a from both sides. The pair of the chuck jaws 39 then move in directions approaching each other (arrows e) to pinch the body 3a. As a result, the pair of the chuck jaws 39 clamps the component 31. Therefore, the pair of the chuck jaws 39 is a pair of clamping members pinching and clamping the component 31.

Subsequently, the pair of the chuck jaws 39 clamping the component 31 is moved to above the substrate 2 preliminarily positioned at a work position. As shown in FIG. 11B, the pair of the chuck jaws 39 is lowered toward the substrate 2 to bring the lower surface of the body 3a into contact with the substrate 2 while inserting the leads 3b into openings 2a formed in the substrate 2. The pair of the chuck jaws 39 then moves in directions away from each other (arrows f) to release the clamping of the component 31. The pusher 44 is then lowered (arrow g) to push the component 31 against the substrate 2. Subsequently, the leads 3b are clinched by a clinching mechanism (not shown). As a result, the component 31 is mounted on the substrate 2.

Figure 12A:
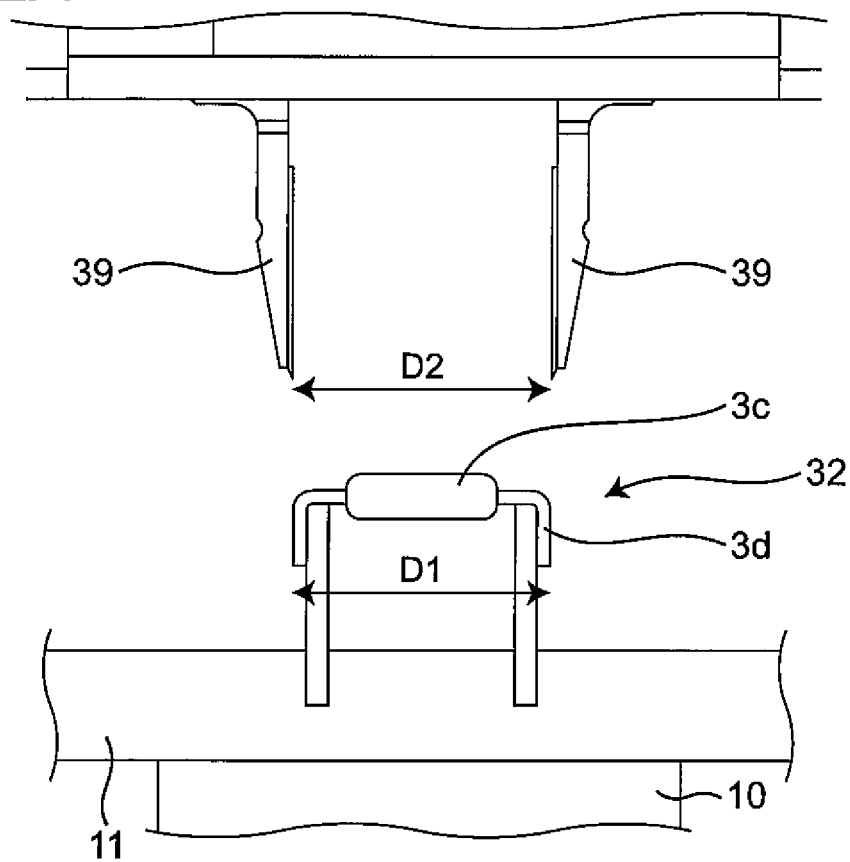
FIG. 12A is an explanatory view of a delivering operation of an axial lead component using the chuck unit in the embodiment of the present invention.

Description will be made of clamping of a component (second component) 32 and a mounting operation onto the substrate 2 with the chuck unit 25 when the component 3 is an axial lead component with reference to FIGS. 12A to 13B. The operation described below is implemented by the control part 70 (FIG. 24) of the component mounting device 1 controlling various mechanisms including the drive motor 37. As shown in FIG. 12A, the component 32 serving as a work object of the chuck unit 25 is a component including leads (second leads) 3d projecting laterally from both sides of a body (second body) 3c with a tip bent downward and is supplied by the parts feeder 10. The conveying chute 11 is provided with a support portion supporting the body 3c, and the body 3c is supported by the support portion so that the component 32 is held in the conveyance chute 11. The component 32 is supplied by the parts feeder 10 in this state.

Figure 12B:
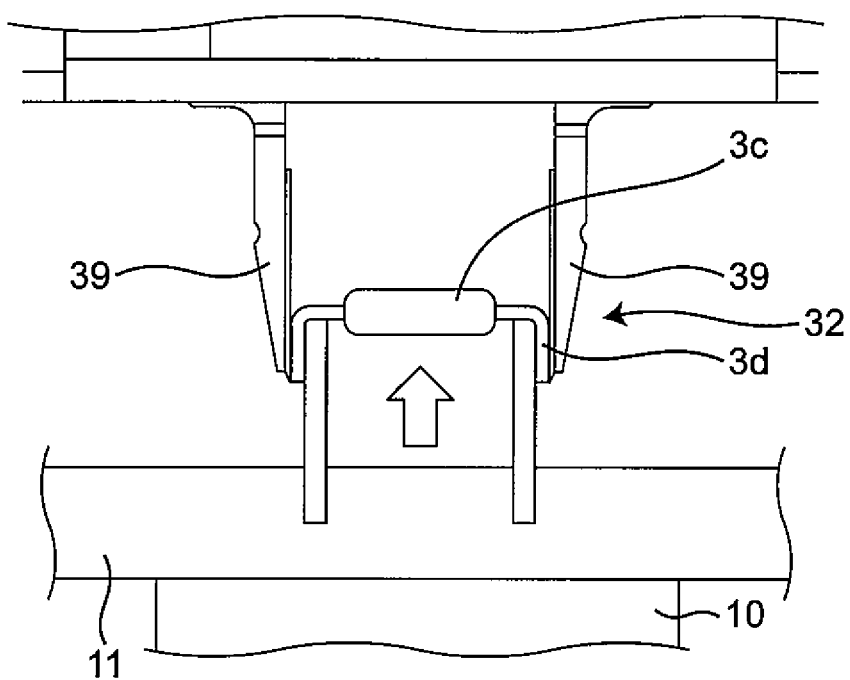
FIG. 12B is an explanatory view of a delivering operation of an axial lead component using the chuck unit in the embodiment of the present invention.

First, as shown in FIG. 12A, an interval D2 of the pair of the chuck jaws 39 is set according to an interval D1 between the leads 3d. The chuck unit 25 is then lowered toward the component 32. As shown in FIG. 12B, the leads 3d are inserted between the chuck jaws 39 by the parts feeder 10 and the leads 3d are held in the holding grooves 40c so that the component 32 is clamped by the chuck jaws 39. The chuck unit 25 is then raised by the head raising/lowering mechanism 26 and the component 32 is lifted from the conveying chute 11 while the chuck jaws 39 are clamping the component 32.

Figure 13A:
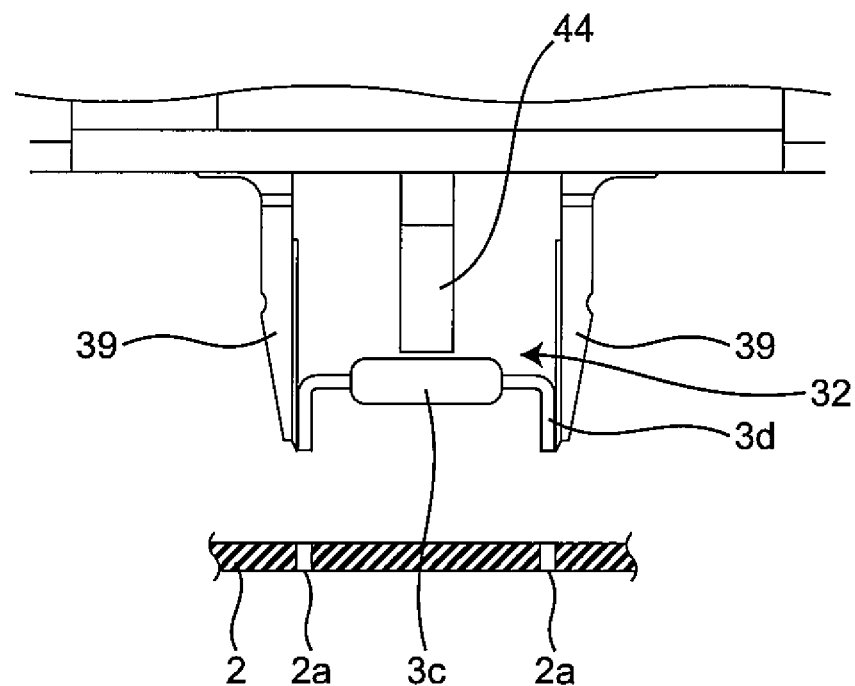
FIG. 13A is an explanatory view of an attaching operation of an axial lead component using the chuck unit in the embodiment of the present invention.
Figure 13B:
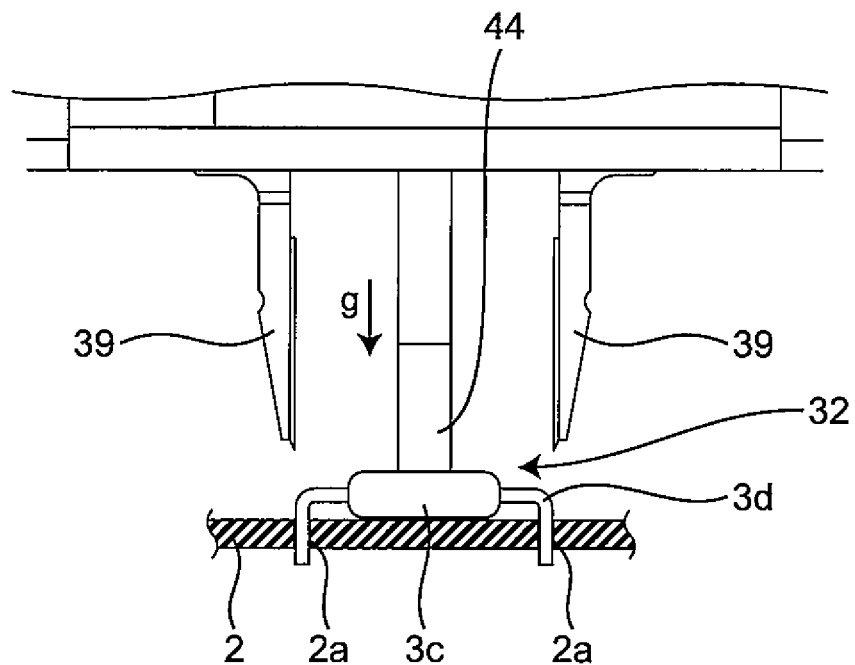
FIG. 13B is an explanatory view of an attaching operation of an axial lead component using the chuck unit in the embodiment of the present invention.

Subsequently, as shown in FIG. 13A, the pair of the chuck jaws 39 in a state of clamping the component 3 is moved to above the substrate 2 preliminarily positioned at a work position. The pair of the chuck jaws 39 is lowered toward the substrate 2 to bring the lower surface of the body 3c into contact with the substrate 2 while inserting the leads 3d into the openings 2a formed in the substrate 2. The pair of the chuck jaws 39 is moved upward to release the clamping of the component 32. As shown in FIG. 13B, the pusher 44 is then lowered (arrow g) to push the component 32 against the substrate 2. Subsequently, the leads 3d are clinched by the clinching mechanism (not shown). As a result, the component 32 is mounted on the substrate 2.

The adapter 50 detachably attached to the chuck jaw 39 will be described with reference to FIGS. 14A to 17B. The adapter 50 is used for clamping the component 3 in place of the chuck jaw 39 and configured to include a flange part 51 and a clamping part 52 disposed under the flange part 51. The flange part 51 is a substantially H-shaped member having notch portions 51a respectively formed at both ends in the longitudinal direction. The notch portions 51a are used when the adapter 50 is stored in the adapter stocker 20 described later. An opening portion 51b opened in the vertical direction is formed substantially at the center of the flange portion 51 in a planar view so as to insert the chuck jaw 39 in the longitudinal direction. The opening portion 51b is set to a size corresponding to the jaw portion 42 of the chuck jaw 39 viewed in the longitudinal direction.

Figure 15A:
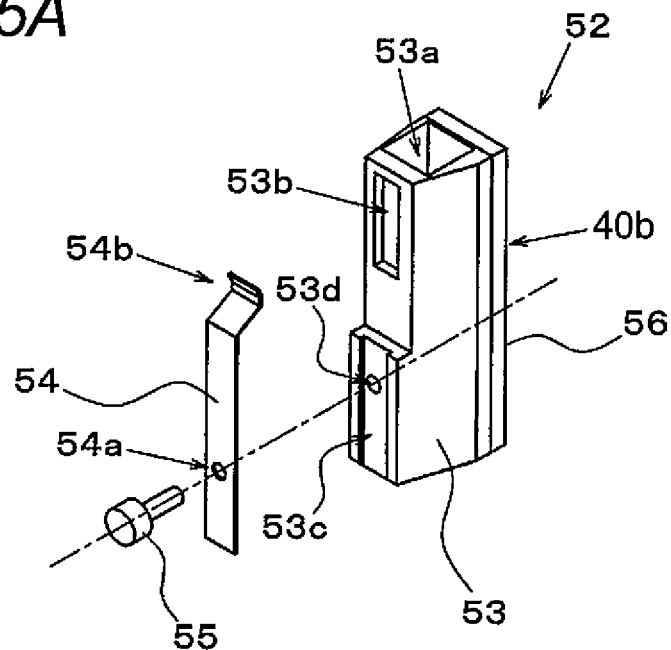
FIG. 15A is a perspective view of an adapter detachably attached to the chuck unit in the embodiment of the present invention.
Figure 15B:
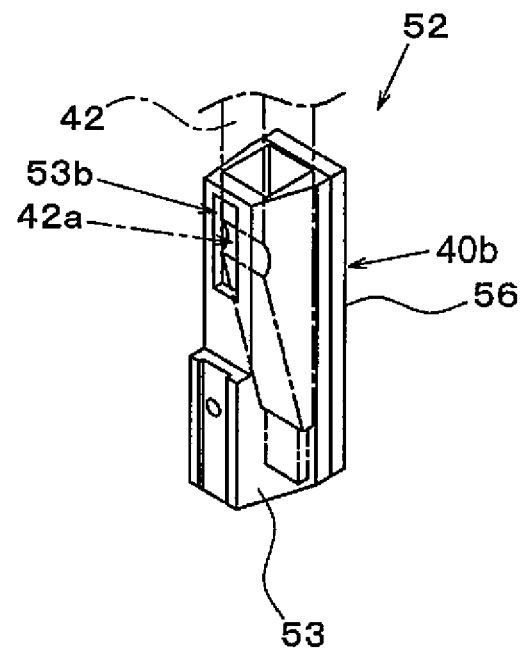
FIG. 15B is a perspective view of the adapter detachably attached to the chuck unit in the embodiment of the present invention.
Figure 16A:
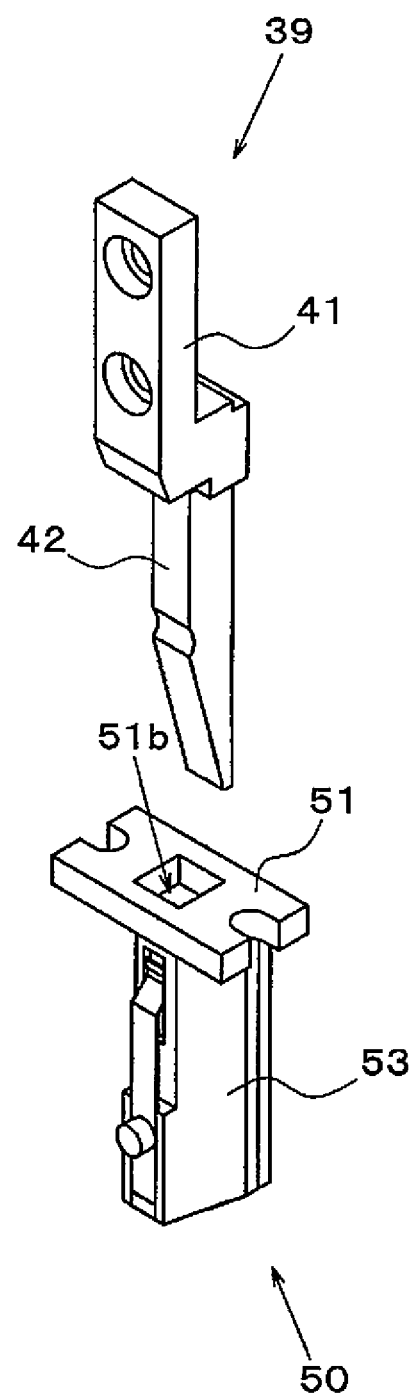
FIG. 16A is a view of a state before the adapter is attached to the chuck jaw in the embodiment of the present invention.
Figure 16B:
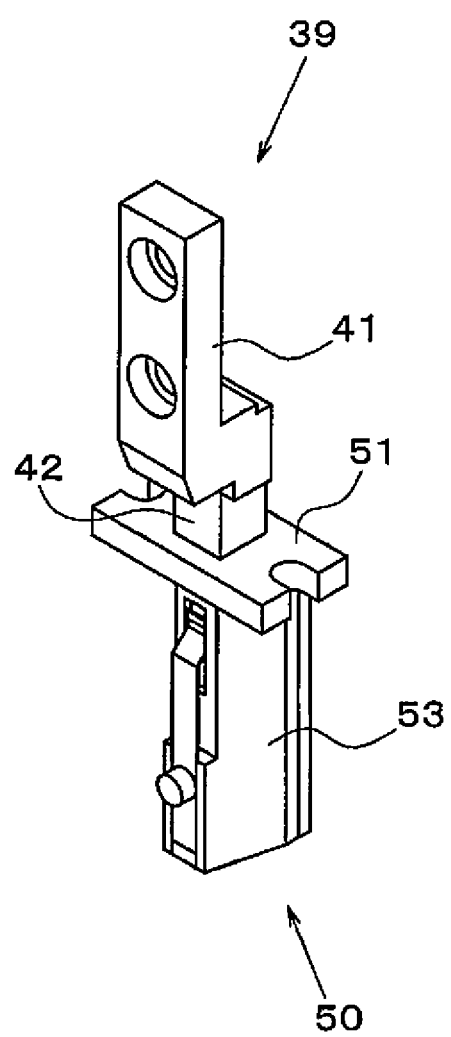
FIG. 16B is a view of a state in which the adapter is attached to the chuck jaw in the embodiment of the present invention.
Figure 16C:
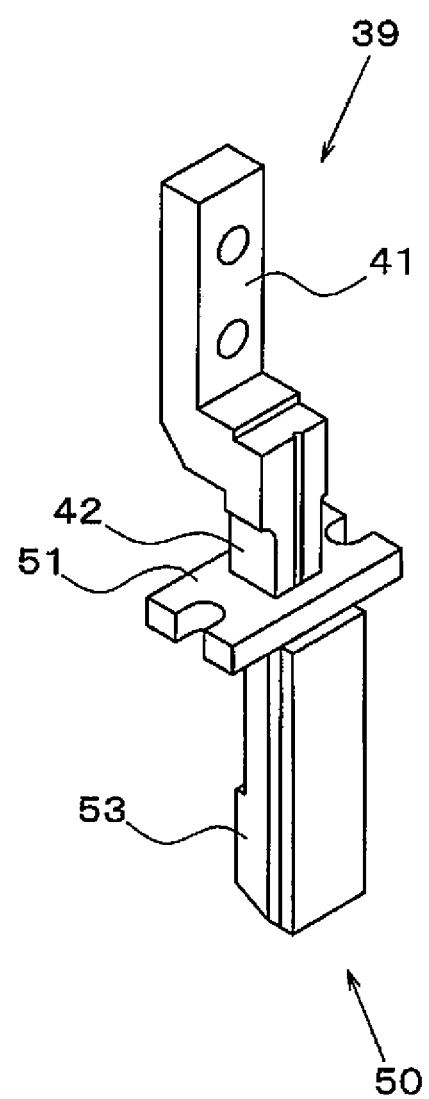
FIG. 16C is a view of a state in which the adapter is attached to the chuck jaw in the embodiment of the present invention.

In FIG. 15A, the clamping part 52 is mainly made up of a block member 53 having a polyhedral structure and has one side surface formed into multiple stages. The block member 53 has a first opening portion 53a formed by opening an upper surface in communication with the opening portion 51b of the flange part 51. The first opening portion 53a is also set to a size corresponding to the jaw portion 42 of the chuck jaw 39 viewed in the longitudinal direction so that the opening portion 51b and the first opening portion 53a form one opening portion continuously in the vertical direction. Therefore, the adapter 50 has an opening portion (the opening portion 51b, the first opening portion 53a) with an upper surface opened. A second opening portion 53b is formed on the upper side of one side surface of the block member 53 in communication with the first opening portion 53a. As shown in FIG. 15B, when the jaw portion 42 is inserted into a deep portion of the block member 53, the locking groove 42a is exposed through the second opening portion 53b.

Figure 14A:
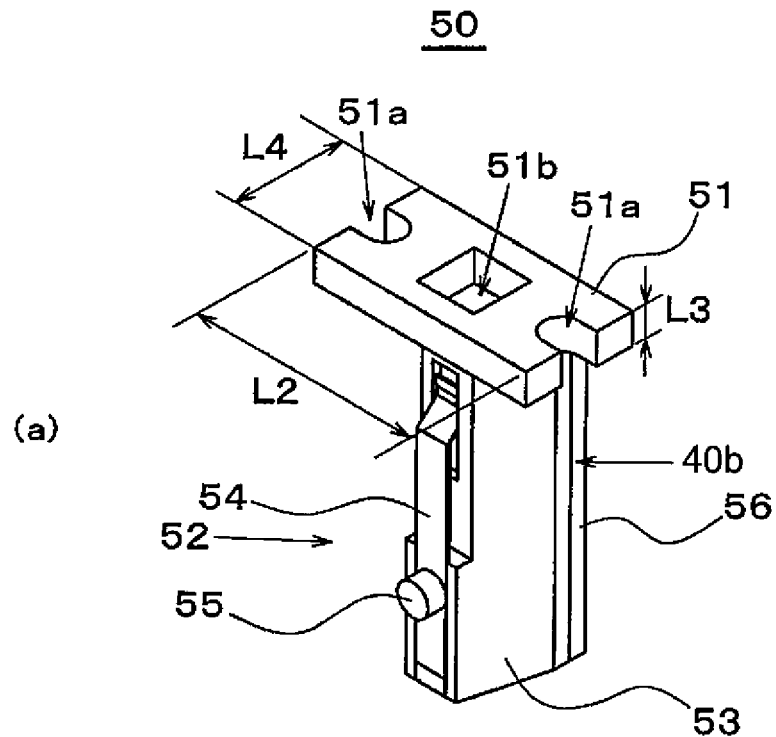
FIG. 14A is a perspective view of an adapter detachably attached to the chuck jaw included in the chuck unit according to the embodiment of the present invention.

On the one side surface of the block member 53, a groove 53c for attaching a flat spring member 54 is formed to extend in the vertical direction at a position below the second opening portion 53b. A screw hole 53d is formed at a position corresponding to the groove 53c and a screw 55 is screwed into the screw hole 53d through a hole portion 54a formed in the flat spring member 54 so that the flat spring member 54 is attached to the block member 53 (FIG. 14A).

The flat spring member 54 is a rectangular flat plate-shaped elastic body extending to the position corresponding to the second opening portion 53*b*. An upper end portion of the flat spring member 54 is a free end and has a bent portion 54*b* formed at a position corresponding to the second opening portion 53*b* and bent toward the inside of the block member 53. While no external force acts on the flat spring member 54, a portion of the bent portion 54*b* passes through the second opening portion 53*b* and further enters the first opening portion 53*a*.

Another side surface of the block member 53 opposite to the one side surface with the second opening portion 53*b* formed is a surface corresponding to the clamping surface 40*a* of the chuck jaw 39 and is a clamping surface 40*b* clamping the component 3. The clamping surface 40*a* of the chuck jaw 39 clamping the component 3 and the clamping surface 40*b* of the adapter 50 clamping the component 3 are different in shape and size. Specifically, the adapter 50 has the clamping surface 40*b* arbitrarily designed in terms of shape and size depending on the shape, size, weight, etc. of the component 3 that is the work object. By attaching the adapter 50 having the clamping surface 40*b* corresponding to the shape/size of the component 3 to the chuck jaw 39, various types of the components 3 can stably be clamped. In this embodiment, a sheet-shaped member 56 acquired by forming an elastic member of urethane rubber etc. into a sheet shape is affixed to the clamping surface 40*b* of the block member 53. The sheet-shaped member 56 is formed into a shape corresponding to the clamping surface 40*b*. When the component 3 is clamped, the sheet-shaped member 56 comes in contact with the component 3 so as not to damage the component 3. The sheet member 56 may not be included.

Figure 17A:
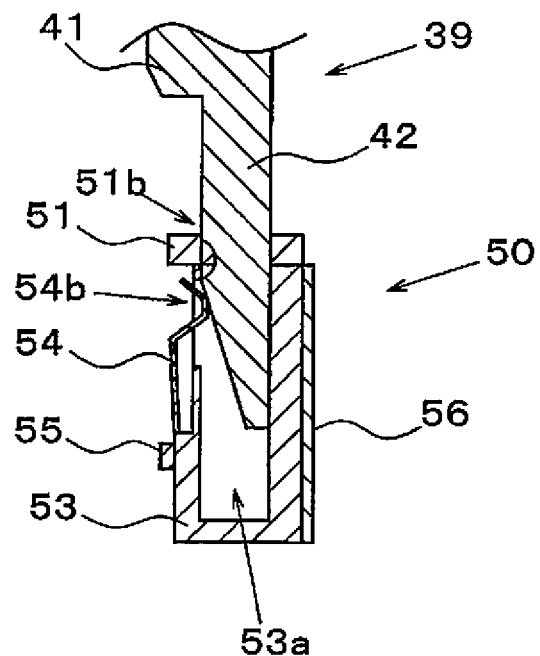
FIG. 17A is a cross-sectional view of the chuck jaw and the adapter in the embodiment of the present invention.
Figure 17B:
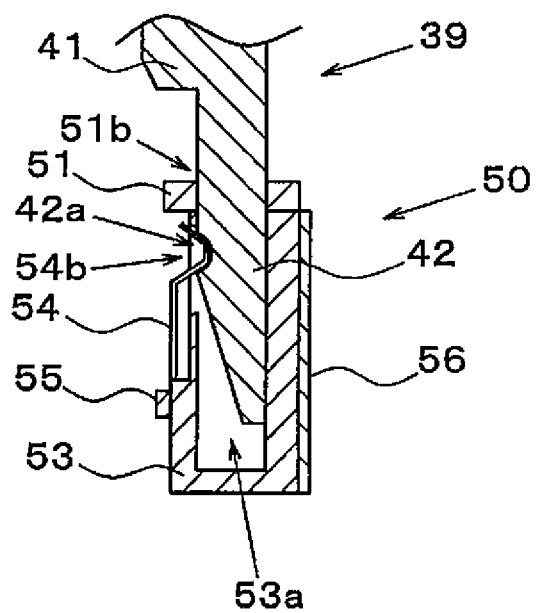
FIG. 17B is a cross-sectional view of the chuck jaw and the adapter in the embodiment of the present invention.

A form of attaching the adapter 50 to the chuck jaw 39 will be described with reference to FIGS. 17A and 17B. FIGS. 17A and 17B show cross-sectional views of the adapter 50 and the chuck jaw 39. First, the chuck jaw 39 is inserted into the opening portion 51*b* of the flange part 51 from the tip portion. As shown in FIG. 17A, in the process of allowing the jaw portion 42 of the chuck jaw 39 to pass through the first opening portion 53*a* of the block member 53, the bent portion 54*b* is pushed in the direction opposite to the bending direction by a surface of the jaw portion 42 (portion in which the engaging groove 42*a* is not formed). Subsequently, as shown in FIG. 17B, at the timing when the locking groove 42*a* of the jaw portion 42 reaches a predetermined position corresponding to the second opening portion 53*b*, the bent portion 54*b* is restored in the bending direction and fitted into the locking groove 42*a*. As a result, the bent portion 54*b* is locked in the locking groove 42*a*, and the adapter 50 is attached to the chuck jaw 39 without falling off. In this way, the bent portion 54*b* of the adapter 50 functions as a locking portion lockable in the locking groove 42*a* of the chuck jaw 39. When the adapter 50 is detached from the chuck jaw 39, the adapter 50 is displaced downward relative to the chuck jaw 39 against the elastic force of the flat spring member 54. As a result, the engagement between the bent portion 54*b* and the locking groove 42*a* is forcibly released, and the adapter 50 is separated from the chuck jaw 39.

Figure 18A:
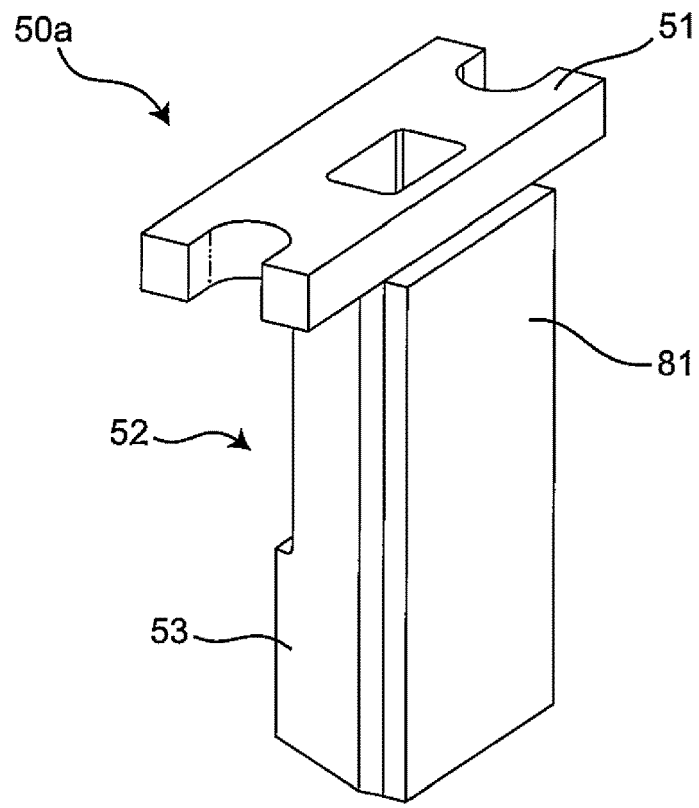
FIG. 18A is a perspective view of the adapter in the embodiment of the present invention.
Figure 18B:
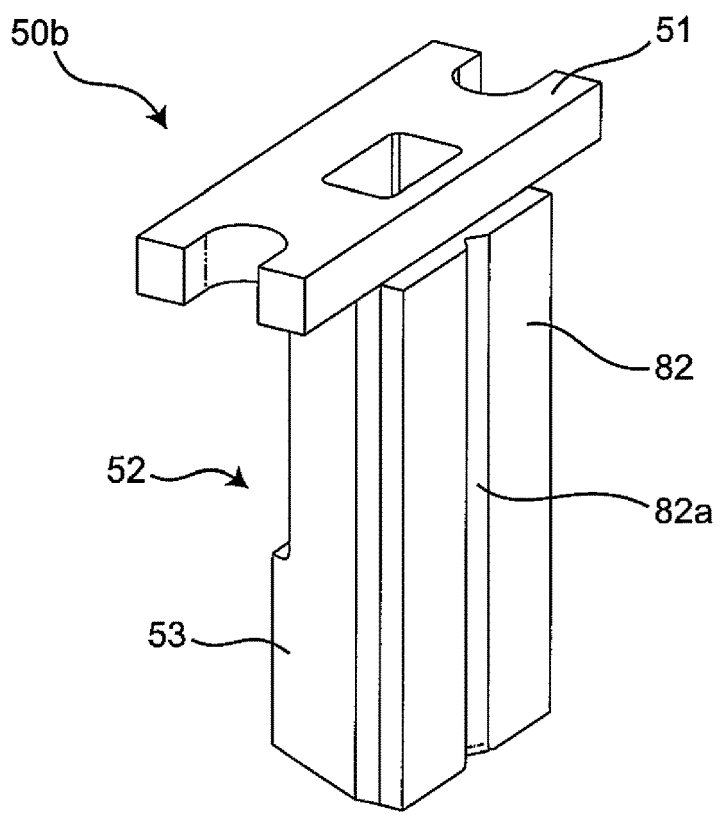
FIG. 18B is a perspective view of the adapter in the embodiment of the present invention.
Figure 19A:
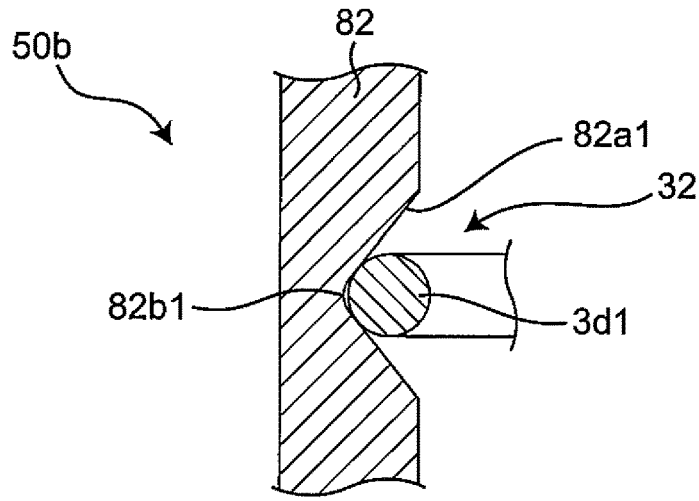
FIG. 19A is a horizontal cross-sectional view of the adapter in the embodiment of the present invention.
Figure 19B:
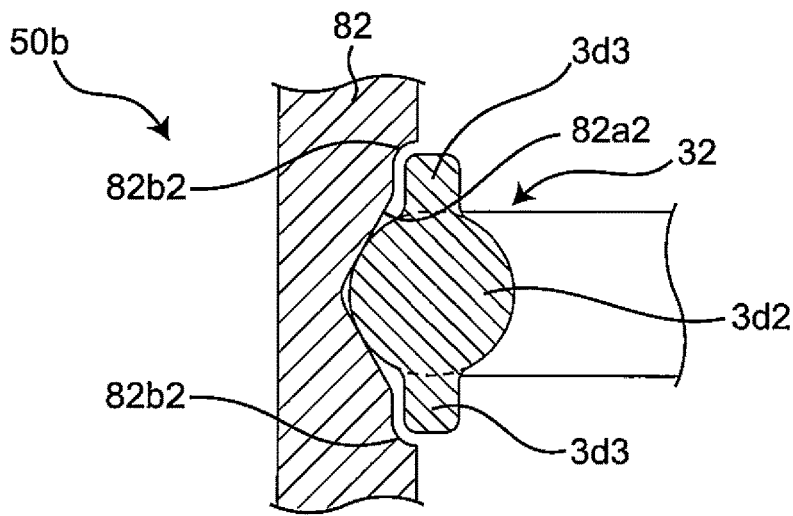
FIG. 19B is a horizontal cross-sectional view of the adapter in the embodiment of the present invention.
Figure 19C:
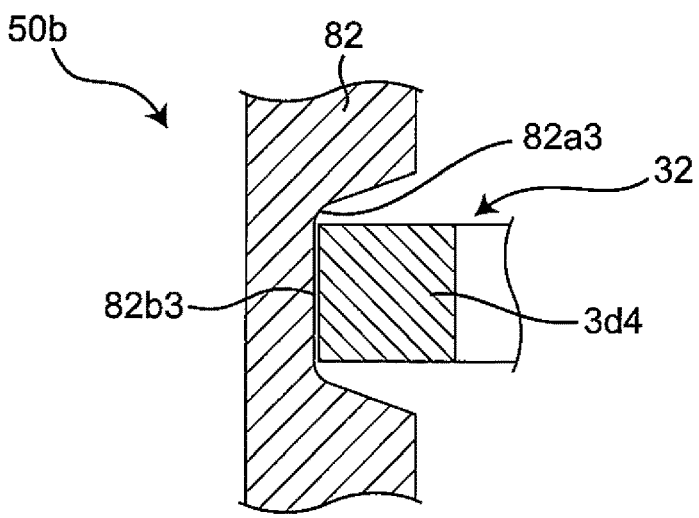
FIG. 19C is a horizontal cross-sectional view of the adapter in the embodiment of the present invention.

As shown in FIGS. 18A and 18B, the adapter 50 includes an adapter 50*a* (first adapter) having a flat clamping surface 81 clamping the body 31*a* of the component 31 and an adapter 50*b* (second adapter) having a holding groove 82*a* holding the lead 3*d* that is an axial portion of the component 32. The clamping surface 81 is covered with an elastic member so as to improve the clamping performance of the component 31. On the other hand, the holding groove 82*a* is formed at the clamping surface 82 of the adapter 50*b* and the clamping surface 82 is made up of a metal member so as to facilitate the formation of the holding groove 82*a*. The holding groove 82*a* extends toward the tip of the adapter 50*b* so as to guide the lead 3*d* of the component 32 toward the substrate 2. Depending on the shape of the lead 3*d* of the component 32, the holding groove 82*a* can have a cross-sectional shape formed into various shapes by mixing linear and curved portions. FIG. 19A shows the case that a lead 3*d*1 of the component 32 has a circular shape in a horizontal cross section. In this case, a holding groove 82*a*1 has a curved portion 82*b*1 holding the lead 3*d*1 in a horizontal cross section. FIG. 19B shows the case that a lead 3*d*2 of the component 32 has a protruding portion 3*d*3 protruding in the radial direction in a horizontal cross section. In this case, a holding groove 82*a*2 has a concave portion 82*b*2 holding the protruding portion 3*d*3 in a horizontal cross section so as to hold the lead 3*d*2. FIG. 19C shows the case that a lead 3*d*4 of the component 32 has a rectangular shape in a horizontal cross section. In this case, a holding groove 82*a*3 has a linear portion 82*b*3 holding the lead 3*d*4 in a horizontal cross section.

Figure 20:
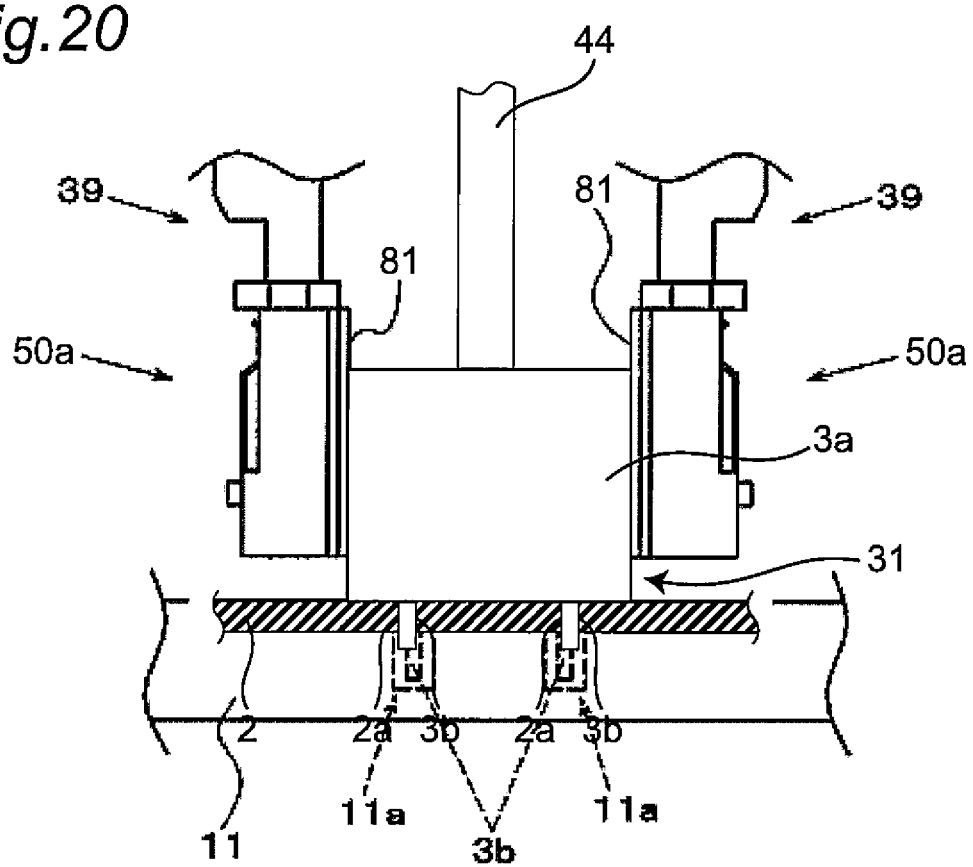
FIG. 20 is an explanatory view of an operation of clamping a component by using the adapters in the embodiment of the present invention.

The clamping of the radial lead component by the adapters 50 is the same as the clamping of the radial lead component by chuck jaws 39. Specifically, as shown in FIG. 20, the adapters 50*a* respectively attached to a pair of the chuck jaws 39 move in directions approaching each other from a state of enclosing the body 3*a* of the component 31 on the conveying chute 11 of the component supply unit 6 from both sides, thereby pinching and clamping the body 3*a* of component 31. In this way, the adapter 50*a* is detachably attached to the chuck jaw 39 (clamping member) and clamps the component 31 in place of the chuck jaw 39. The clamping surface 81 of the adapter 50*a* is covered with the elastic member (the sheet member 56). Subsequently, on the substrate 2, the pusher 44 is lowered to push the component 31 against the substrate 2. As a result, the component 31 is mounted on the substrate 2.

Figure 21:
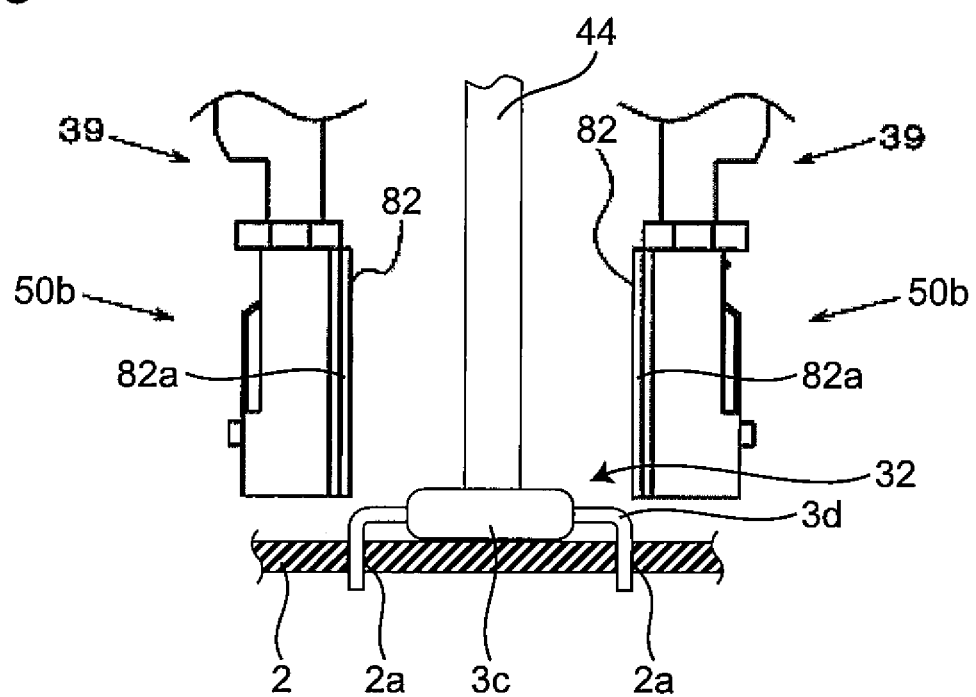
FIG. 21 is an explanatory view of an operation of clamping a component by using the adapters in the embodiment of the present invention.

The clamping of the axial lead component by the adapters 50 is the same as the clamping of the axial lead component by the chuck jaws 39. Specifically, as shown in FIG. 21, the adapters 50*b* respectively attached to a pair of the chuck jaws 39 have a distance between the adapters 50*b* set according to the interval between the leads 3*d* of the component 32 on the conveying chute 11. The chuck unit 25 is then lowered toward the component 32. The component 32 is inserted between the adapters 50*b* and held such that the leads 32*d* of the component 32 are disposed along the holding groove 82*a*, and the component 32 is clamped. Subsequently, on the substrate 2, the pusher 44 is lowered to push the component 32 against the substrate 2. As a result, the component 32 is mounted on the substrate 2.

The adapter 50 is also used when a work object is the large-sized component 3 such as the component 3 that cannot stably be clamped by the chuck jaw 39, for example. Specifically, since the chuck jaw 39 is incorporated in the chuck unit 25, a replacement work of the chuck jaw 39 requires a predetermined time and results in a large amount of operator's labor. Therefore, in this embodiment, the adapters 50 having the clamping surfaces 40*b* corresponding to the size and shape of the component 3 are attached to the chuck jaws 39 and the component 3 is clamped by using the adapters 50. Therefore, by attaching the adapters 50 to the chuck jaws 39 depending on the component 3 to be mounted and clamping the component 3 by using the adapters 50, the clamping form of the component can easily be changed depending on the component 3 without the need for the operator's replacement work. Additionally, by employing a configuration in which the adapter 50 is attached to or detached from the chuck jaw 39 by fitting the bent portion 54b (the locking portion) into the locking groove 42a or releasing the fitting of the bent portion 54b into the locking groove 42a, the attachment and detachment of the adapter 50 is further facilitated.

The operator prepares the multiple adapters 50 having the clamping surfaces 40b corresponding to the shapes and sizes of the various components 3 at a production site. The adapters 50 suitable for the component 3 are appropriately attached to the chuck jaws 39 to produce a mounted substrate. By attaching the adapters 50 to the chuck jaws 39 depending on the component 3 to be mounted and clamping and mounting the component 3 by using the adapters 50 onto the substrate 2, flexible production can be implemented according to various types of the components 3.

Figure 22A:
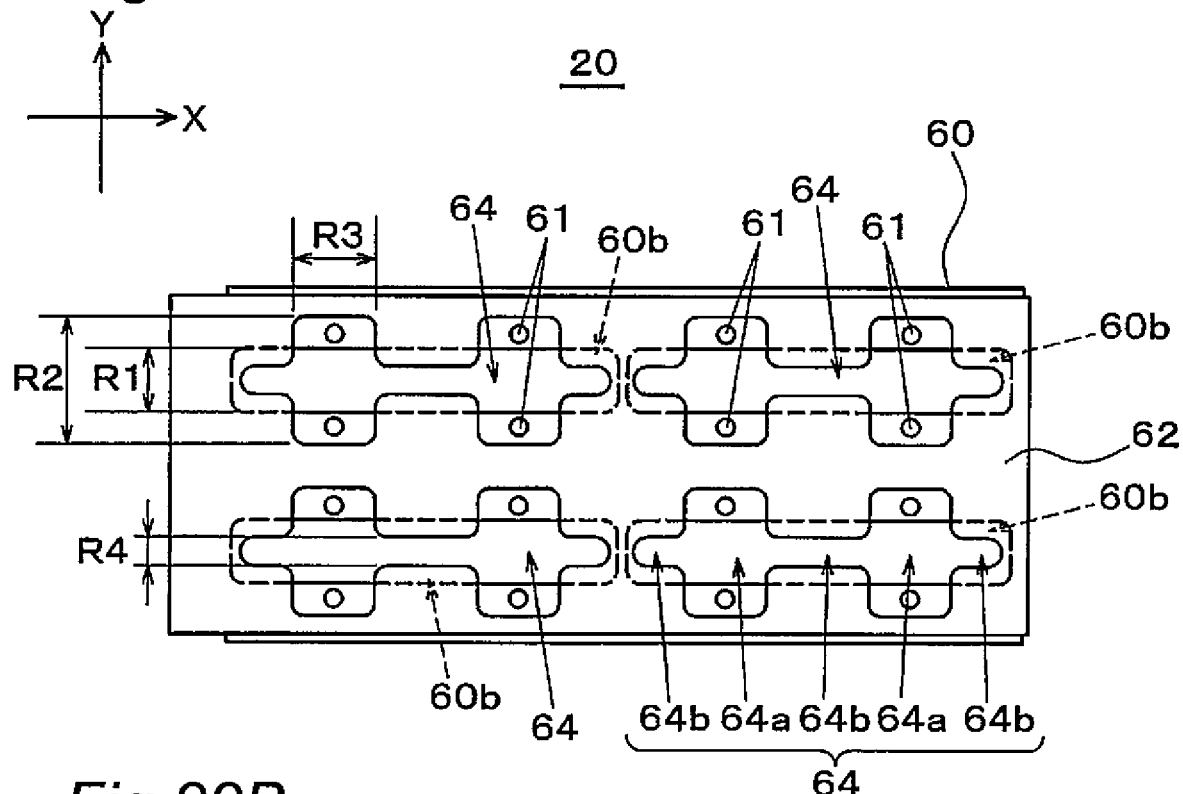
FIG. 22A is a plane view of an adapter stocker included in the component mounting device in the embodiment of the present invention.
Figure 22B:
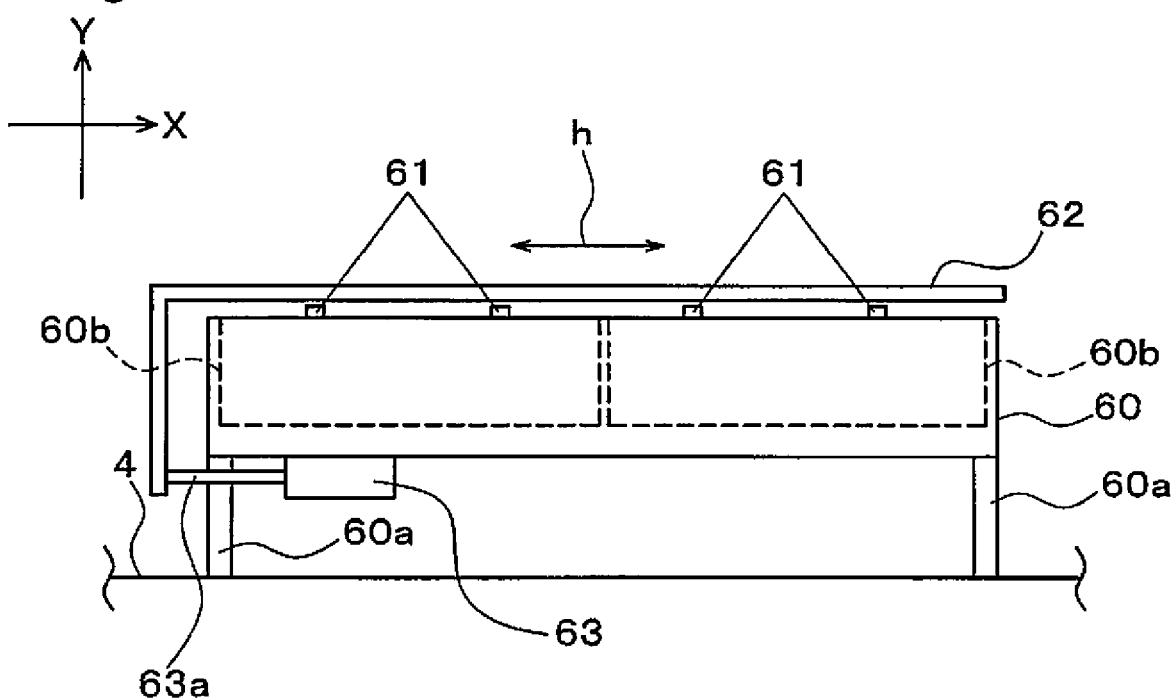
FIG. 22B is a side view of the adapter stocker included in the component mounting device in the embodiment of the present invention.

The adapter stocker 20 will be described with reference to FIGS. 22A and 22B. The adapter stocker 20 functions as a storage means storing the adapter 50. The adapter stocker 20 includes a storage block 60 supported by the base 4 with support brackets 60a. In the storage block 60, multiple (in this case, four) storage openings 60b for storing and holding the adapters 50 in an upright posture are disposed in a lattice arrangement. The storage openings 60b each extend in the X direction such that a pair of the adapters 50 is stored and held. Therefore, the adapter stocker 20 of this example can store a total of four pairs of the adapters 50.

Figure 14B:
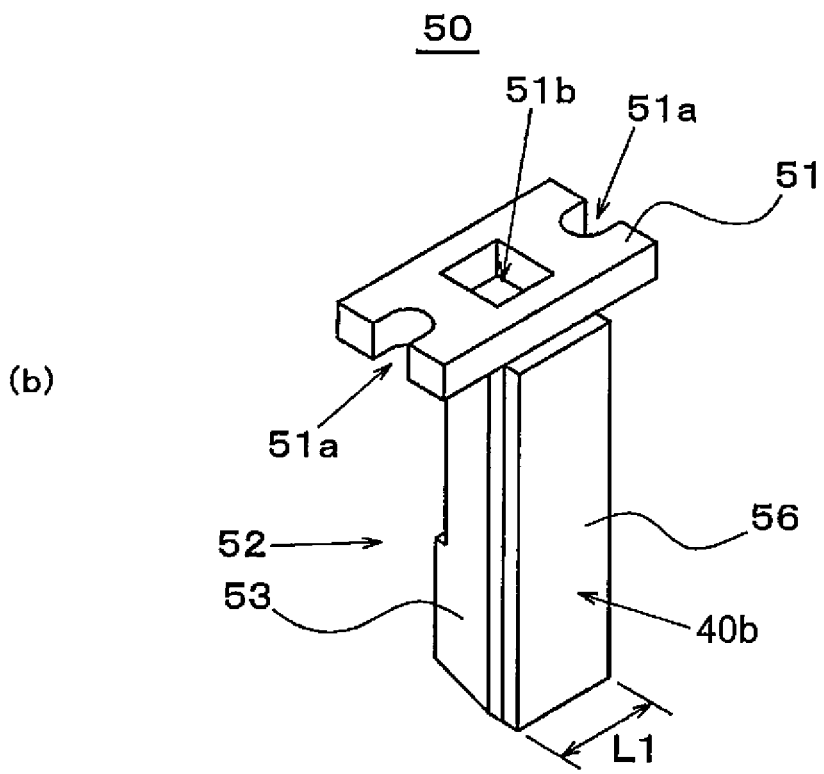
FIG. 14B is a perspective view of the adapter detachably attached to the chuck jaw included in the chuck unit in the embodiment of the present invention.
Figure 26A:
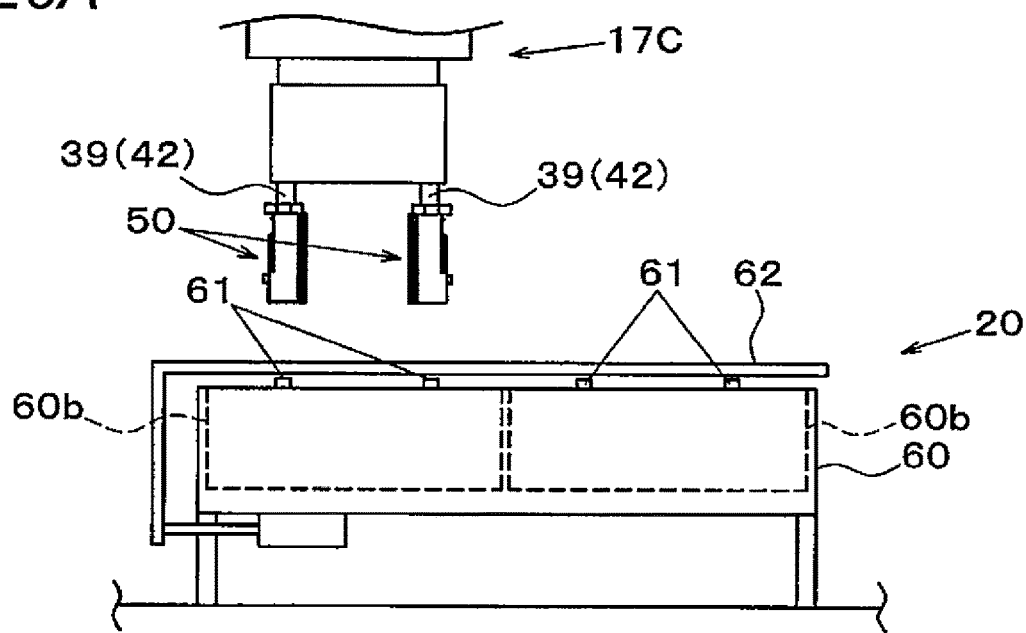
FIG. 26A is an explanatory view of an operation of detaching the adapter attached to the chuck jaw in the embodiment of the present invention.
Figure 26B:
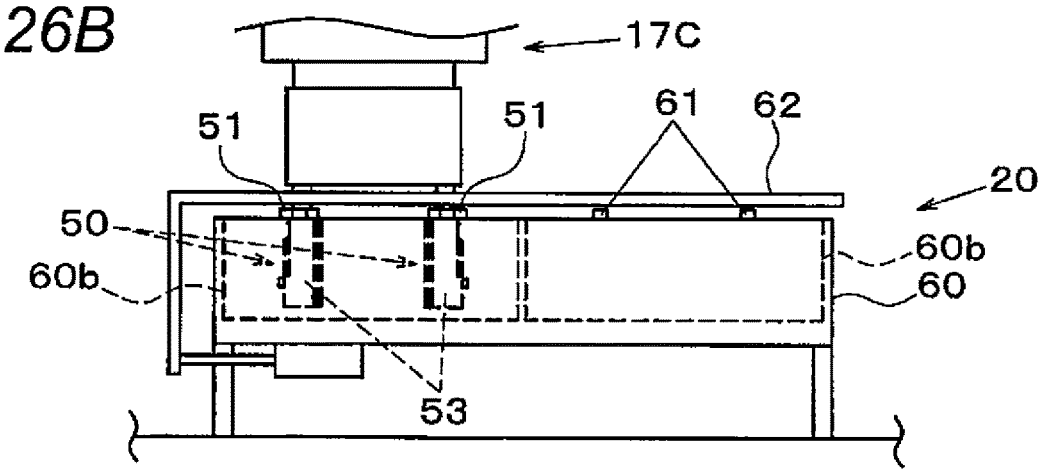
FIG. 26B is an explanatory view of an operation of detaching the adapter attached to the chuck jaw in the embodiment of the present invention.

A length dimension R1 of the storage opening 60b in the Y direction is set larger than a diameter dimension L1 of the block member 53 of the adapter 50 in the longitudinal direction shown in FIG. 14B and smaller than a diameter dimension L2 of the flange part 51 of the adapter 50 in the longitudinal direction shown in FIG. 14A. Therefore, in a state of the adapter 50 stored and held in the storage block 60, both end portions of the flange part 51 are in contact with an upper surface of the storage block 60 and the block member 53 is received in the storage opening 60b (FIGS. 26A and 26B).

Figure 27:
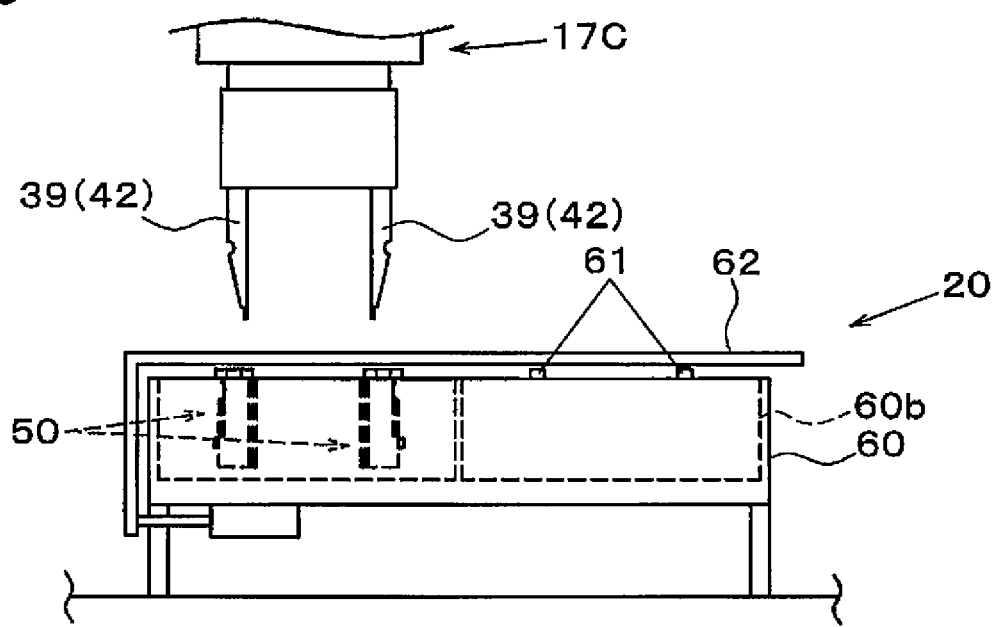
FIG. 27 is an explanatory view of an operation of detaching the adapter attached to the chuck jaw in the embodiment of the present invention.

On the upper surface of the storage block 60, upward convex-shaped convex portions 61 are disposed in pairs with the storage openings 60b interposed therebetween in the Y direction. An interval between the paired convex portions 61 is set to an interval corresponding to the notch portions 51a of the flange part 51. A thickness dimension of the convex portions 61 is set to be smaller than a predetermined gap between a locking plate 62 described later and the upper surface of the storage block 60 and is set in this embodiment to be substantially the same as a thickness dimension L3 of the flange part 51 shown in FIG. 14A. By engaging the notch portions 51a of the flange part 51 with the convex portions 61, the adapter 50 stored and held in the storage block 60 is fixedly positioned in the horizontal plane (FIG. 27). Therefore, the convex portions 61 and the notch portions 51a of the flange part 51 serve as a storage position fixing means for fixing the storage position of the adapter 50.

The locking plate 62 having a shape covering substantially the entire range of the storage block 60 is disposed slidably in the horizontal direction above the storage block 60 while maintaining a predetermined gap with the upper surface of the storage block 60. One end portion of the locking plate 62 is coupled to a rod 63a of a slide mechanism 63 disposed on a lower surface of the storage block 60. The slide mechanism 63 projects and retracts the rod 63a through driving of a drive motor (not shown). As a result, the locking plate 62 reciprocates above the storage block 60 (arrow h).

The predetermined gap between the locking plate 62 and the upper surface of the storage block 60 is set larger than the thickness dimension L3 of the flange part 51 (FIG. 14A) and the thickness dimension of the convex portions 61 so as not to prevent the locking plate 62 from sliding while the adapters 50 are stored and held in the storage block 60.

The locking plate 62 has multiple opening portions 64 disposed at positions corresponding to the arrangement of the multiple storage openings 60b. The opening portions 64 are each made up of multiple (in this case, two) adapter insertion openings 64a and a relief opening 64b penetrating the centers of the multiple adapter insertion openings 64a in the X direction, and these openings are continuously formed. The adapter insertion openings 64a have an opening width dimension R2 in the Y direction set larger than the diameter dimension L2 (FIG. 14A) of the flange part 51 of the adapter 50 in the longitudinal direction and an opening dimension width R3 in the X direction set larger than a diameter dimension L4 of the flange part 51 in the width direction shown in FIG. 14A. Therefore, the adapter insertion openings 64a are sized such that the adapters 50 can be inserted in the vertical direction. The two adapter insertion openings 64a are arranged at an interval corresponding to the adapters 50 respectively attached to a pair of the chuck jaws 39, so that the adapters 50 attached to a pair of the chuck jaws 39 can be inserted at the same time.

Figure 23A:
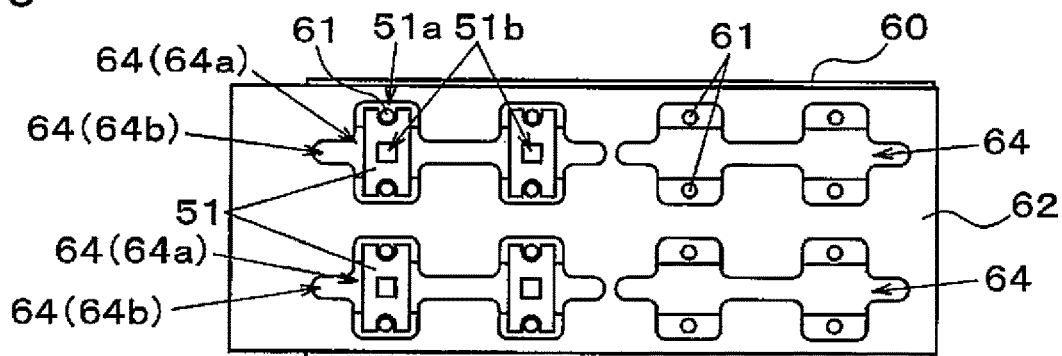
FIG. 23A is a plane view of the adapter stocker included in the component mounting device in the embodiment of the present invention.
Figure 23B:
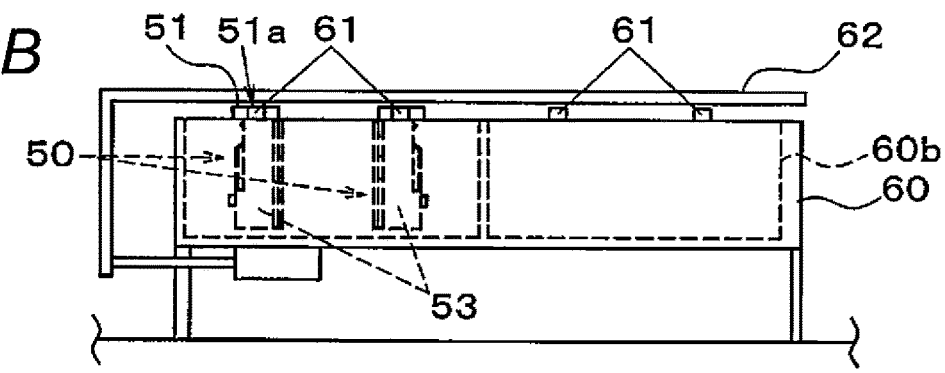
FIG. 23B is a side view of the adapter stocker included in the component mounting device in the embodiment of the present invention.
Figure 23C:
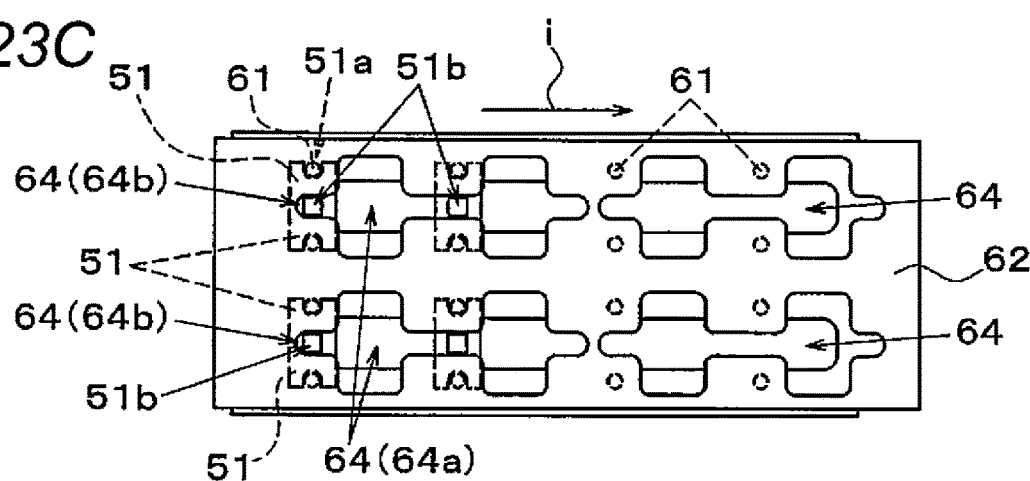
FIG. 23C is a plane view of the adapter stocker included in the component mounting device in the embodiment of the present invention.

The relief opening 64b has a size capable of communicating with the opening portion 51b of the flange part 51 in the vertical direction. Therefore, even if the locking plate 62 is slid in an arbitrary direction, the opening portion 51b of the flange part 51 of the adapter 50 stored and held in the storage block 60 is always in communication with either the adapter insertion opening 64a or the relief opening 64b in the vertical direction (FIGS. 23A, 23C). Therefore, even when the locking plate 62 is moved in an arbitrary direction, the jaw portion 42 of the chuck jaw 39 does not interfere with a body of the locking plate 62 so that the jaw portion 42 can be inserted into and pulled out from the opening portion 51b of the flange part 51.

A function of the locking plate 62 will be described with reference to FIGS. 23A to 23D. FIGS. 23A and 23B show a state in which two pairs of the adapters 50 are stored in the adapter stocker 20. The adapters 50 are stored and held in the storage block 60 with the convex portions 61 engaged with the notch portions 51a of the flange part 51 and the block members 53 received in the storage openings 60b. In this state, the locking plate 62 is at a position where the relief opening 64b does not overlap the flange part 51 in the vertical direction, and the adapter insertion openings 64a overlap the adapters 50 in the vertical direction, so that the locking plate 62 does not inhibit the insertion of the adapters 50. Therefore, in this state, the already stored and held adapters 50 can be taken out from the adapter stocker 20, and the adapters 50 can newly be stored and held in the empty storage openings 60b in which the adapters 50 are not stored.

Figure 23D:
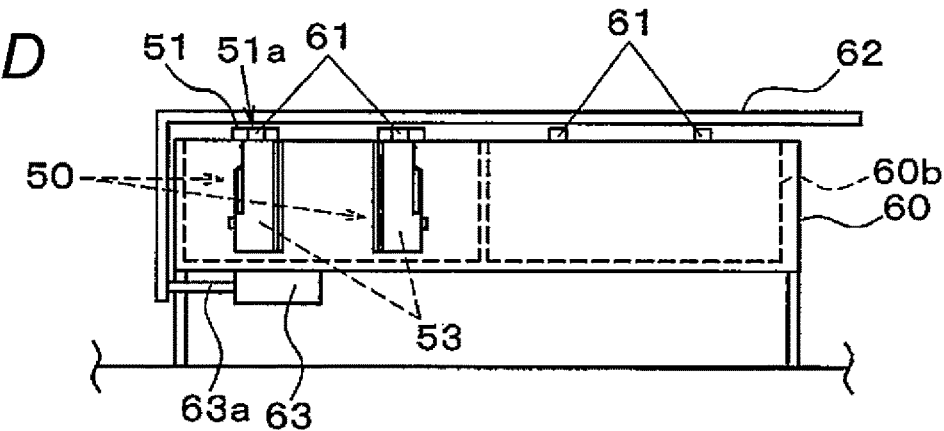
FIG. 23D is a side view of the adapter stocker included in the component mounting device in the embodiment of the present invention.

FIGS. 23C and 23D show a state in which the sliding mechanism 63 is driven to slide the locking plate 62 in a direction of an arrow i. Therefore, the locking plate 62 is moved by the driving of the slide mechanism 63 so that the body of the locking plate 62 vertically overlaps regions including both end portions of the flange part 51 brought into contact with the upper surface of the storage block 60. In this state, the upward movement of the adapters 50 are restricted by the locking plate 62. In other words, the adapters 50 are locked by the locking plate 62 included in the adapter stocker 20. The opening portions 51b of the flange parts 51 are still in communication with the relief openings 64b in the vertical direction even when the locking plate 62 is slid. Therefore, even when the adapters 50 are locked by the locking plate 62, the adapters 50 can be attached to and detached from the chuck jaws 39.

Figure 24:
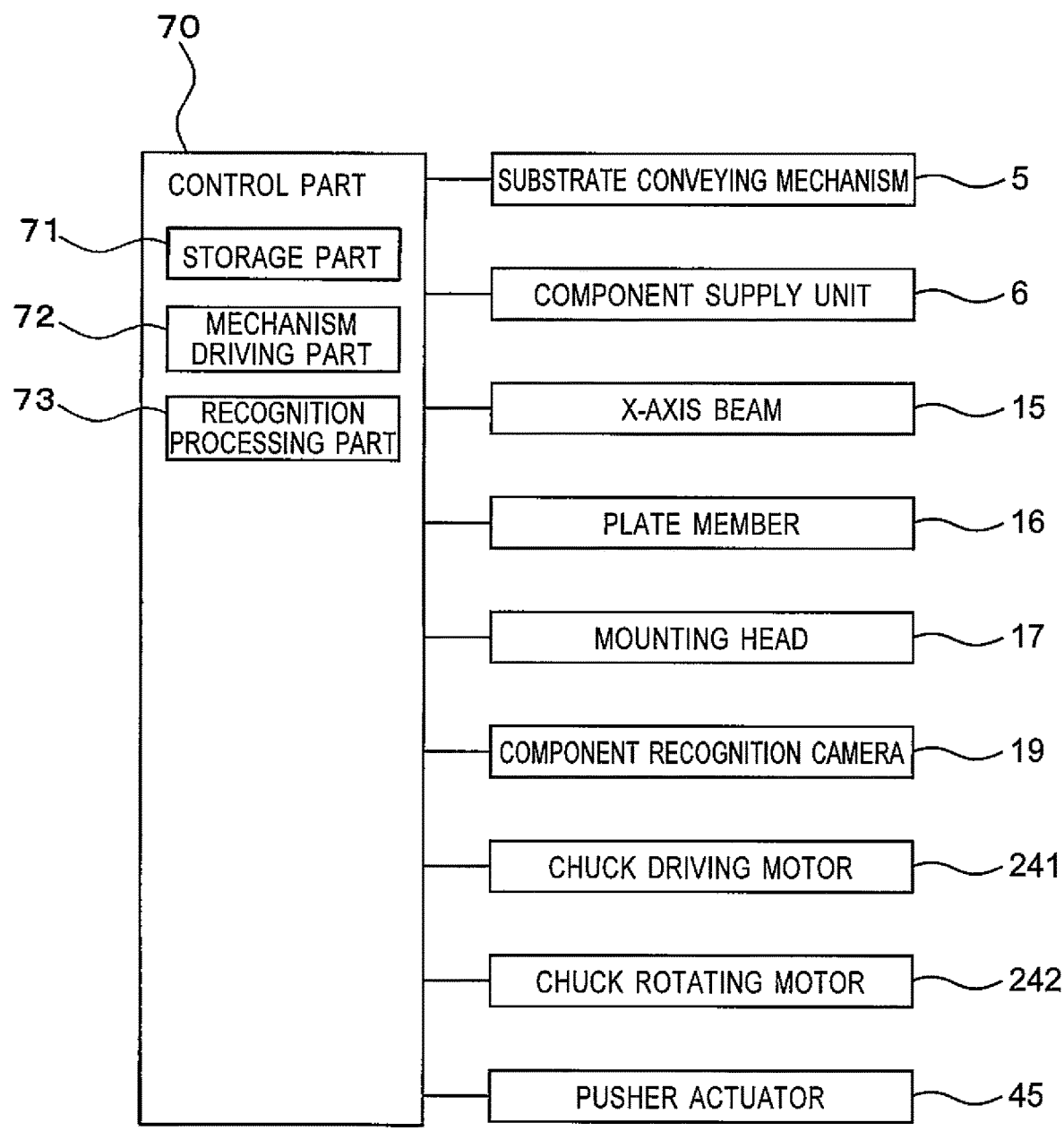
FIG. 24 is a block diagram of a configuration of a control system of the component mounting device in the embodiment of the present invention.

A configuration of a control system of the component mounting device 1 will be described with reference to FIG. 24. The control part 70 included in the component mounting device 1 is configured to include a storage part 71, a mechanism driving part 72, and a recognition processing part 73. The control part 70 is connected to a substrate conveying mechanism 5, the component supply unit 6, the X-axis beam 15, the plate member 16, the mounting head 17, the component recognition camera 19, the chuck driving motor 241, the chuck rotating motor 242, and the pusher actuator 45.

The storage part 71 stores various production data necessary for mounting the component 3 on the substrate 2. The mechanism driving part 72 is controlled by the control part 70 to drive the substrate conveying mechanism 5, the component supply unit 6, the X-axis beam 15, the plate member 16, the mounting head 17, the component recognition camera 19, the chuck driving motor 241, the chuck rotating motor 242, and the pusher actuator 45. As a result, a component mounting work is performed. The mechanism driving part 72 also drives the X-axis beam 15, the plate member 16, the mounting head 17, the chuck driving motor 241, and the chuck rotating motor 242. As a result, a work for attaching/detaching the adapter 50 to/from the chuck jaw 39 is performed. The chuck driving motor 241 and the chuck rotation motor 242 are preferably servo motors. Particularly, by using a servo motor for the chuck driving motor 241, switching can be made between a load control function of preferentially controlling a clamping force of clamping the component 3 and a position control function of preferentially controlling an interval between the chuck jaws 39 or the adapters 50*b*, depending on a type of the component 3.

The recognition processing part 73 executes a recognition process of an image acquired by the component recognition camera 19 to detect a substrate mark (not shown) formed on the substrate 2, the component 3 supplied to a component supply position by the component supply unit 6, and the component 3 held by the mounting head 17. The detection results of the substrate mark and the component 3 are used when the mounting head 17 is aligned with the substrate 2 at the time of mounting of the component 3.

Figure 25A:
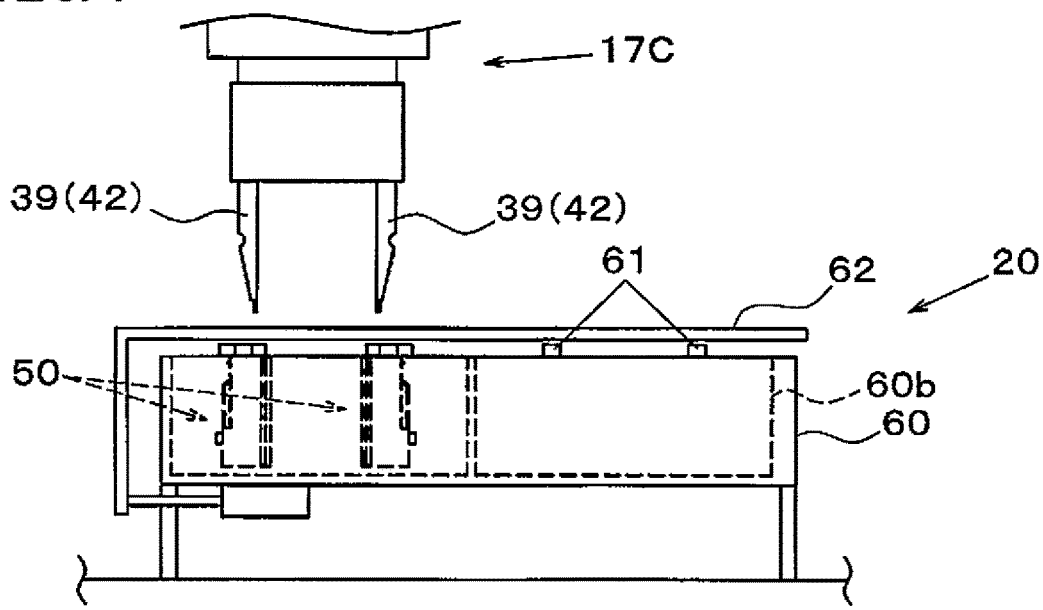
FIG. 25A is an explanatory view of an operation of attaching the adapter to the chuck jaw in the embodiment of the present invention.
Figure 25B:
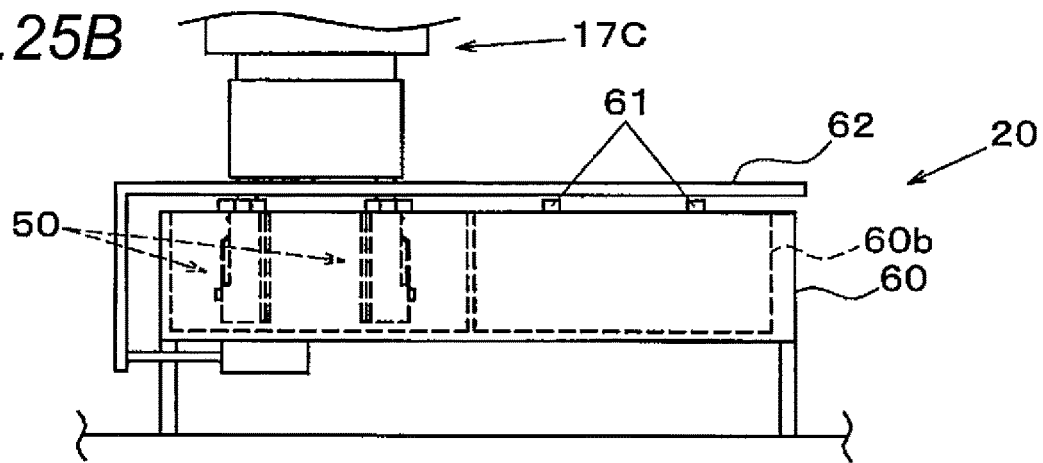
FIG. 25B is an explanatory view of an operation of attaching the adapter to the chuck jaw in the embodiment of the present invention.

The component mounting device 1 in this embodiment is configured as described above. An operation of attaching the adapter 50 to the chuck jaw 39 will be described with reference to FIGS. 25A to 25C. First, as shown in FIG. 25A, the unit head 17C is moved to above the adapter stocker 20, and a pair of the chuck jaws 39 is aligned above a pair of the adapters 50 to be mounted (ST1: alignment step). As shown in FIG. 25B, the unit head 17C is then lowered to insert the jaw portions 42 of the chuck jaws 39 from the tips into the opening portions 51*b* of the flange parts 51 (ST2: inserting step). Before executing (ST2), the locking plate 62 is moved in advance such that the adapters 50 and the adapter insertion openings 64*a* coincide with each other in the vertical direction (FIGS. 23A and 23B).

Figure 25C:
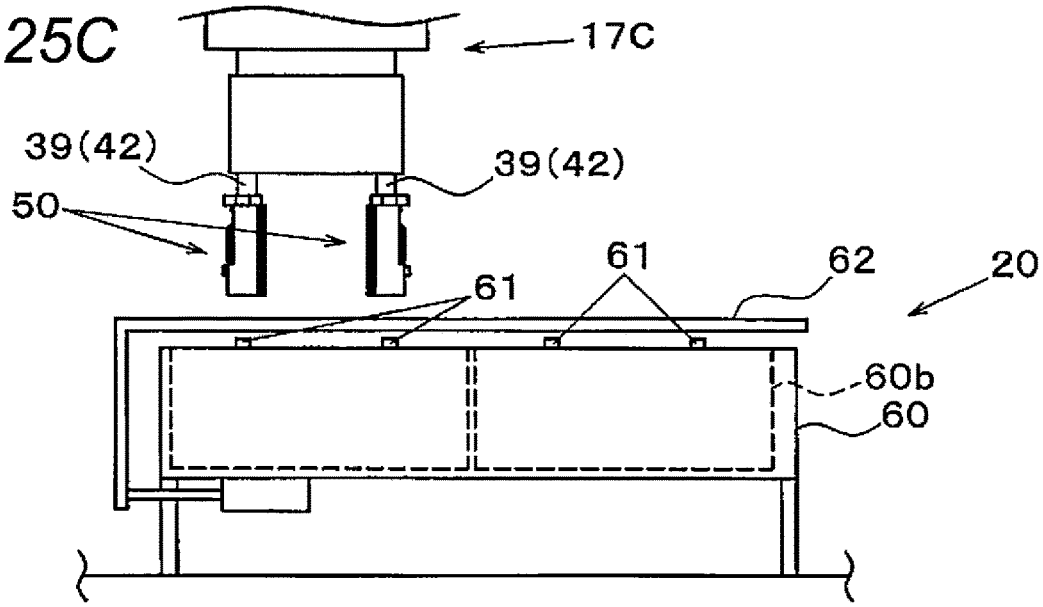
FIG. 25C is an explanatory view of an operation of attaching the adapter to the chuck jaw in the embodiment of the present invention.

Subsequently, at a predetermined timing in the process of allowing the jaw portions 42 of the chuck jaws 39 to pass through the first opening portions 53*a* of the block members 53, the bent portions 54*b* of the flat spring members 54 are fitted and locked into the locking grooves 42*a* of the jaw portions 42 (FIG. 17B). As a result, the adapters 50 are attached to the chuck jaws 39. As shown in FIG. 25C, the unit head 17C is then raised to take out the adapters 50 attached to the chuck jaws 39 from the adapter stocker 20.

In this way, in the present embodiment, the chuck jaws 39 are lowered from above the adapters 50 in the state of being stored in the adapter stocker 20 to insert the chuck jaws 39 into the opening portions (the opening portion 51*b*, the first opening portion 53*a*) and the adapters 50 are thereby attached to the chuck jaws 39. Therefore, the clamping members (the chuck jaws 39, the adapters 50) can easily be switched in a short time depending on a size of the component 3. Additionally, a pair of the adapters 50 can automatically be attached at the same time to the chuck jaws 39 without an operator's manual work.

An operation of detaching the adapter 50 attached to the chuck jaw 39 will be described with reference to FIGS. 26A to 26C and 27. First, as shown in FIG. 26A, the unit head 17C is moved to above the adapter stocker 20, and a pair of the adapters 50 is aligned above the storage openings 60*b* that are storage destinations (ST11: alignment step). As shown in FIG. 26B, the unit head 17C is then lowered so that the block members 53 are received in the storage openings 60*b* and that both end portions of the flange parts 51 are brought into contact with the upper surface of the storage block 60. As a result, the adapters 50 are stored and held in the storage block 60 (ST22: storage step). In this state, the convex portions 61 are engaged with the notch portions 51*a* of the flange parts 51 so that the positions of the adapters 50 are fixed in the horizontal plane. Before executing (ST22), the locking plate 62 is moved in advance such that the adapters 50 attached to the chuck jaws 39 and the adapter insertion openings 64*a* coincide with each other in the vertical direction (FIGS. 23A and 23B).

Figure 26C:
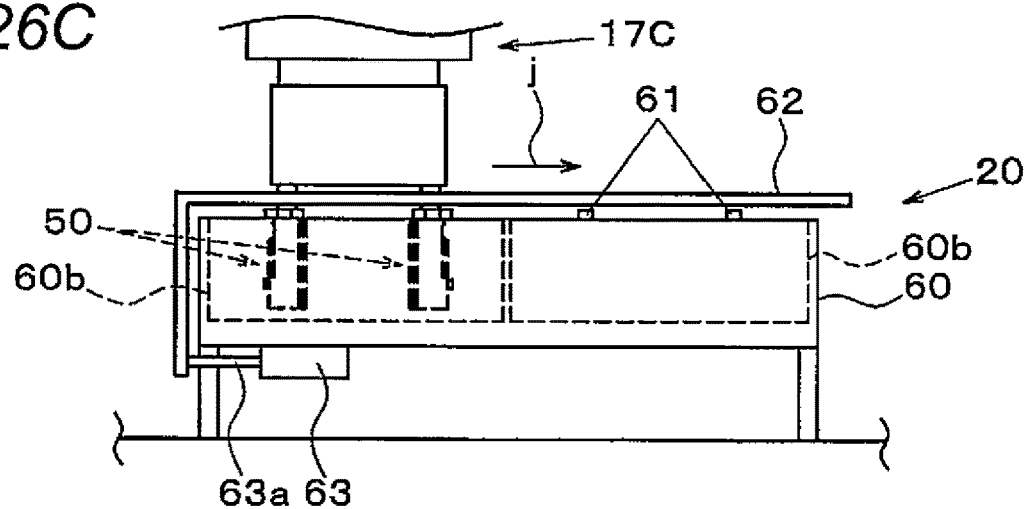
FIG. 26C is an explanatory view of an operation of detaching the adapter attached to the chuck jaw in the embodiment of the present invention.

Subsequently, as shown in FIG. 26C, the locking plate 62 is slid (arrow j) to lock the stored and held adapters 50 (ST23: locking step) (see also FIGS. 23C and 23D). As a result, the upward movement of the adapters 50 is restricted. As shown in FIG. 27, the unit head 17C is raised to detach the adapters 50 from the chuck jaws 39 (ST24: detachment step). Specifically, in the process of raising the unit head 17C, the flange parts 51 are brought into contact with the lower surface of the body of the locking plate 62 and prevented from moving upward. When the unit head 17C is further raised, the locked state between the bent portions 54*b* and the locking grooves 42*a* is forcibly released, and the adapters 50 are separated from the chuck jaws 39. As a result, the adapters 50 are automatically detached from the chuck jaws 39.

A method of mounting a component for mounting the component 3 supplied by the parts feeder 10 onto the substrate 2 will be described. First, the control part 70 determines whether the component 3 to be mounted can be clamped by the chuck jaws 39 (ST31: determination step). If it is determined at (ST31) that the component cannot be clamped, the control part 70 executes a process for attaching to the chuck jaws 39 the adapters 50 suitable for clamping the component 3 (ST32: clamping member attachment step). Specifically, the unit head 17C accesses the adapter stocker 20. The chuck jaws 39 are lowered from above the adapters 50 stored and held in the adapter stocker 20 to insert the chuck jaws 39 into the opening portions and the adapters 50 are thereby attached to the chuck jaw 39.

If it is determined at (ST31) that the component 3 to be mounted can be clamped by the chuck jaws 39, or after the adapters 50 are attached to the chuck jaws 39 at (ST32), the mounting head 17 is moved to the position of supply of the component 3 by the parts feeder 10.

If the component 3 is a radial lead component, the body 3a of the component 3 is disposed between the paired chuck jaws 39 or adapters 50a, and the paired chuck jaws 39 or adapters 50a approach each other in this state so as to clamp the body 3a of the component 3 from the lateral sides (ST33a: approaching step). The component 3 is then clamped so as not to exceed a maximum value of the clamping force of clamping the component 3 (ST34a: clamping step). If the component 3 is an axial lead component, the distance between the paired chuck jaws 39 or adapters 50b is fixed to an inter-lead distance (ST33b: interval fixing step). The second component 32 is then inserted between the paired chuck jaws 39 or adapters 50b at the fixed interval, such that the second leads 32d of the second component 32 are disposed along the holding grooves 40c, 82a (ST34b: inserting step).

Subsequently, the mounting head 17 is moved to above the substrate 2 preliminarily positioned at a predetermined work position. The unit head 17C is then lowered so that the component 3 clamped by the chuck jaws 39 or the adapters 50 is pushed by the pusher 44 and mounted on the substrate 2 (ST35: mounting step). Therefore, at this mounting step (ST35), the component 3 is clamped and mounted on the substrate 2 by using the chuck jaws 39 or the adapters 50 attached to the chuck jaws 39. As described above, according to this embodiment, the adapters 50 suitable for clamping the component 3 are automatically attached to the chuck jaws 39 as needed and the component 3 is clamped and mounted on the substrate 2 by using the adapters 50, so that the flexible production can be implemented according to various types of the components 3.

According to the component mounting device 1 having the configuration described above, the following effects can be exerted.

The pair of the chuck jaws 39 is able to clamp both the first component 3 including the first body 3a and the first lead 3b projecting downward from the lower portion of the first body 3a and the second component 32 including the second body 3c and the second lead 3d projecting laterally from both side portions of the second body 3c with a tip bent downward, and the pair of the chuck jaws 39 has facing portions each provided with the clamping surface 40a contacting the first body 3a of the first component 31 and the holding groove 40c formed at the clamping surface 40a and holding the second lead 3d of the second component 32. Therefore, the clamping can be performed by the chuck jaws 39 in accordance with the shape of the component 3, and the first component 31 and the second component 32 can more reliably be clamped.

The holding groove 40c extends toward the tip of the chuck jaw 39 to guide the second lead 3d toward the substrate 2. Therefore, the second component 32 can easily be guided toward the substrate 2 while the second component 32 is clamped.

The control part 70 provides different control, i.e., control of managing a clamping force, for example, control of managing a maximum value of the clamping force, or control of managing an interval of a pair of the chuck jaws 39, depending on whether the chuck jaw 39 clamps the first component 31 or the second component 32. Therefore, the control of clamping corresponding to the shape of the component 3 can be provided by the chuck jaws 39 so that the first component 31 and second component 32 can more reliably be clamped.

When the chuck jaws 39 clamp the first component 31, the control part 70 provides control of managing the clamping force at which the pair of the chuck jaws 39 clamps the first component 31, for example, control of managing the maximum value of the clamping force, and when the chuck jaws 39 clamp the second component 32, the control part 70 provides control of managing the interval of the pair of the chuck jaws 39 so as to fix the interval between the second leads 3d held in the holding grooves 40c. Therefore, the control of clamping corresponding to the shape of the component 3 can be provided by the chuck jaws 39 so that the first component 31 and second component 32 can more reliably be clamped.

The adapters 50 include the adapters 50a each having the flat clamping surface 81 clamping the first body 3a of the first component 31 and the adapters 50b each having the holding groove 82a holding the lead 3d that is an axial portion of the second component 32. Therefore, the clamping corresponding to the shape of the component 3 can be performed by the adapters 50 so that the first component 31 and second component 32 can more reliably be clamped.

The flat clamping surface 81 of the adapter 50a is covered with an elastic member. Therefore, the adapters 50a can easily clamp the body 3a of the first component 31.

The clamping surface 82 having the holding groove 82a of the adapter 50b is made up of a metal member. Therefore, the holding groove 82a holding the lead 3d of the second component 32 can easily be formed.

The adapters 50b include a plurality of types different in cross-sectional shape of the holding groove 82a corresponding to a cross-sectional shape of the lead 3d. Therefore, the second components 32 including the leads 3d having various shapes can be clamped.

When the adapters 50 clamp the first component 31, the control part 70 provides control of managing a clamping force at which the pair of the adapters 50a clamps the first component 31, for example, control of managing a maximum value of the clamping force, and when the adapters 50 clamp the second component 32, the control part 70 provides control of managing the interval of the pair of the adapters 50b so as to fix the interval between the second leads 3d held in the holding grooves 82a. Therefore, the control of clamping corresponding to the shape of the component 3 can be provided by the adapters 50 so that the first component 31 and second component 32 can more reliably be clamped.

The component mounting device 1 in the present invention is not limited to the embodiments described above and can be implemented without departing from the spirit of the present invention. For example, the chuck jaw 39 may be made up only of the jaw portion 42 without including the base portion 41 such that a predetermined position of the jaw portion 42 is fixed by the jaw attachment seat 98a, 98b.

The present invention can provide the component mounting device capable of easily changing a clamping form depending on a component and the method of mounting a component by using the component mounting device and is therefore particularly useful in the field of component mounting.

What is claimed is:

1. A component mounting device for mounting a plurality of component on a substrate, comprising:
   a pair of opening/closing members opening and closing; and
   a plurality of adapters detachably attached to the opening/closing members, wherein
   the plurality of adapters includes first adapters and second adapters, the first adapters are attached to the opening/closing members when a first component is to be mounted on the substrate and the second adapters are attached to the opening/closing members when a second component is to be mounted on the substrate, wherein the first component is different from the second component, and wherein the first adapters have opposing first clamping surfaces, the opposing first clamping surfaces each having a flat clamping surface configured to clamp a body of the first component, and wherein the second adapters have a second opposing clamping surfaces, the second opposing clamping surface each having a holding groove configured to clamp an axial portion of the second component.

2. The component mounting device according to claim 1, wherein the axial portion has a lead projecting laterally from both side portions of the body of the second component with a tip bent downward, and wherein the holding groove extends toward a tip of the second adapter to guide the lead toward the substrate.

3. The component mounting device according to claim 1, wherein the flat clamping surfaces of the first adapter are covered with an elastic member.

4. The component mounting device according to claim 1, wherein the holding grooves of the second adapter are made up of a metal member.

5. The component mounting device according to claim 1, wherein a cross-sectional shape of the holding grooves corresponds to a cross-sectional shape of a lead projecting laterally from the axial portion of the second component.

6. A method of mounting a component by using a component mounting device for mounting components on a substrate, wherein the component mounting device includes a plurality of adapters detachably attached to a pair of opening/closing members opening and closing, wherein the plurality of adapters includes first adapters, each of the first adapters having a flat clamping surface configured to clamp a body of a first component and second adapters, each of the second adapters having a holding groove configured to hold an axial portion of a second component, wherein the first component is different from the second component, and wherein the method comprises:

determining the first component or the second component to be mounted on the substrate;

selecting the first adapters if the first component is to be mounted or the second adapters if the second component is to be mounted;

attaching the selected first adapters or second adapters to the opening/closing members; and clamping the determined first or second component by using the attached adapters and mounting the determined first or second component on the substrate.

7. The method of mounting a component according to claim 6, wherein the axial portion of the second component has a lead projecting laterally from both side portions of the body with a tip bent downward, and wherein the holding grooves of the second adapters correspond to a cross-sectional shape of the lead.

8. A component mounting device for mounting a plurality of components on a substrate, comprising:

a pair of jaws; and a plurality of adapter pairs configured to clamp the components for mounting to the substrate, wherein each pair of the plurality of adapter pairs can be automatically detached or attached to the pair of jaws via a spring connection without manual interference by an operator, and wherein the plurality of adapter pairs includes a first adapter pair having a first clamping surface configured to engage a first component and a second adapter pair having a second clamping surface to engage a second component, the first clamping surface being of a different cross sectional shape than the second clamping surface, wherein the first component is different from the second component.

* * * * *